US012125908B2

(12) United States Patent
Chan et al.

(10) Patent No.: US 12,125,908 B2
(45) Date of Patent: Oct. 22, 2024

(54) SEMICONDUCTOR DEVICE AND METHOD

(71) Applicant: Taiwan Semiconductor Manufacturing Company, Ltd., Hsinchu (TW)

(72) Inventors: Chia-Ling Chan, New Taipei (TW); Meng-Yueh Liu, Taoyuan (TW); Wei-Ken Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 153 days.

(21) Appl. No.: 17/751,198

(22) Filed: May 23, 2022

(65) Prior Publication Data

US 2022/0285552 A1 Sep. 8, 2022

Related U.S. Application Data

(63) Continuation of application No. 16/908,305, filed on Jun. 22, 2020, now Pat. No. 11,342,454, which is a
(Continued)

(51) Int. Cl.
*H01L 29/78* (2006.01)
*H01L 21/225* (2006.01)
(Continued)

(52) U.S. Cl.
CPC ...... *H01L 29/7833* (2013.01); *H01L 21/2254* (2013.01); *H01L 21/31111* (2013.01);
(Continued)

(58) Field of Classification Search
CPC ............. H01L 21/2254; H01L 21/3111; H01L 21/31133; H01L 21/31144; H01L 21/31155; H01L 21/823821; H01L 29/0649; H01L 29/0684; H01L 29/66492; H01L 29/66545; H01L 29/6656; H01L 29/66795; H01L 29/7833; H01L 29/7848; H01L 29/785
(Continued)

(56) References Cited

U.S. PATENT DOCUMENTS 8,030,718 B2 10/2011 Huang et al.
9,558,946 B2 1/2017 Tsai et al.
(Continued)

FOREIGN PATENT DOCUMENTS

CN 101673765 A 3/2010
CN 106067479 A 11/2016
(Continued)

*Primary Examiner* — Fazli Erdem
(74) *Attorney, Agent, or Firm* — Slater Matsil, LLP

(57) ABSTRACT

In accordance with some embodiments, a method is provided. The method includes: forming a semiconductor fin protruding from a substrate; depositing a spacer layer over the semiconductor fin; after the depositing the spacer layer over the semiconductor fin, implanting a first dopant in the spacer layer and depositing a dopant layer of the first dopant on the spacer layer in alternating repeating steps; removing the dopant layer; and performing a thermal anneal process to drive the first dopant into the semiconductor fin from the spacer layer.

20 Claims, 30 Drawing Sheets

Related U.S. Application Data continuation of application No. 15/816,259, filed on Nov. 17, 2017, now Pat. No. 10,700,197.

(60) Provisional application No. 62/565,752, filed on Sep. 29, 2017.

(51) Int. Cl.
| | |
|---|---|
| *H01L 21/311* | (2006.01) |
| *H01L 21/3115* | (2006.01) |
| *H01L 21/8238* | (2006.01) |
| *H01L 29/06* | (2006.01) |
| *H01L 29/66* | (2006.01) |

(52) U.S. Cl.
CPC .. *H01L 21/31133* (2013.01); *H01L 21/31144* (2013.01); *H01L 21/31155* (2013.01); *H01L 21/823821* (2013.01); *H01L 29/0649* (2013.01); *H01L 29/66492* (2013.01); *H01L 29/66545* (2013.01); *H01L 29/6656* (2013.01); *H01L 29/66795* (2013.01); *H01L 29/7848* (2013.01); *H01L 29/785* (2013.01)

(58) Field of Classification Search
USPC .......................................................... 257/408
See application file for complete search history.

(56) References Cited

U.S. PATENT DOCUMENTS

| | | |
|---|---|---|
| 9,711,533 B2 | 7/2017 | Ching et al. |
| 2006/0244051 A1 | 11/2006 | Izumida et al. |
| 2011/0195555 A1 | 8/2011 | Tsai et al. |
| 2011/0269287 A1 | 11/2011 | Tsai et al. |
| 2016/0099150 A1* | 4/2016 | Tsai ................. H01L 29/66545 |
| | | 438/283 |
| 2016/0163816 A1 | 6/2016 | Yu et al. |
| 2016/0315191 A1* | 10/2016 | Tsai .................... H01L 27/0924 |
| 2017/0179290 A1 | 6/2017 | Lo et al. |
| 2018/0151695 A1 | 5/2018 | Huang et al. |
| 2018/0151701 A1 | 5/2018 | Chen et al. |
| 2018/0151706 A1 | 5/2018 | Lin et al. |
| 2018/0374760 A1* | 12/2018 | Chan ................. H01L 29/66803 |
| 2019/0027473 A1 | 1/2019 | Chen et al. |
| 2020/0259001 A1 | 8/2020 | Chan et al. |

FOREIGN PATENT DOCUMENTS

| | | |
|---|---|---|
| CN | 106158962 A | 11/2016 |
| CN | 106601737 A | 4/2017 |
| TW | 201624544 A | 7/2016 |

\* cited by examiner

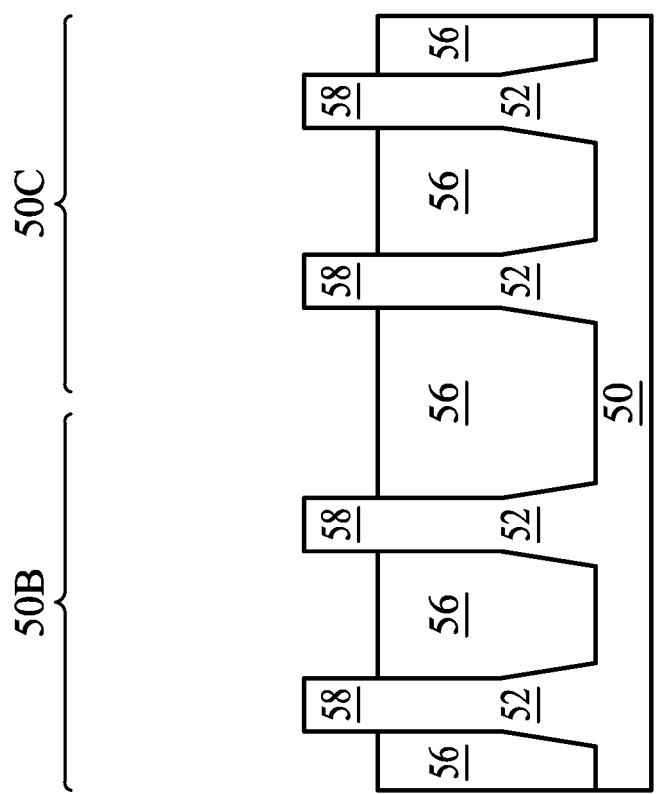

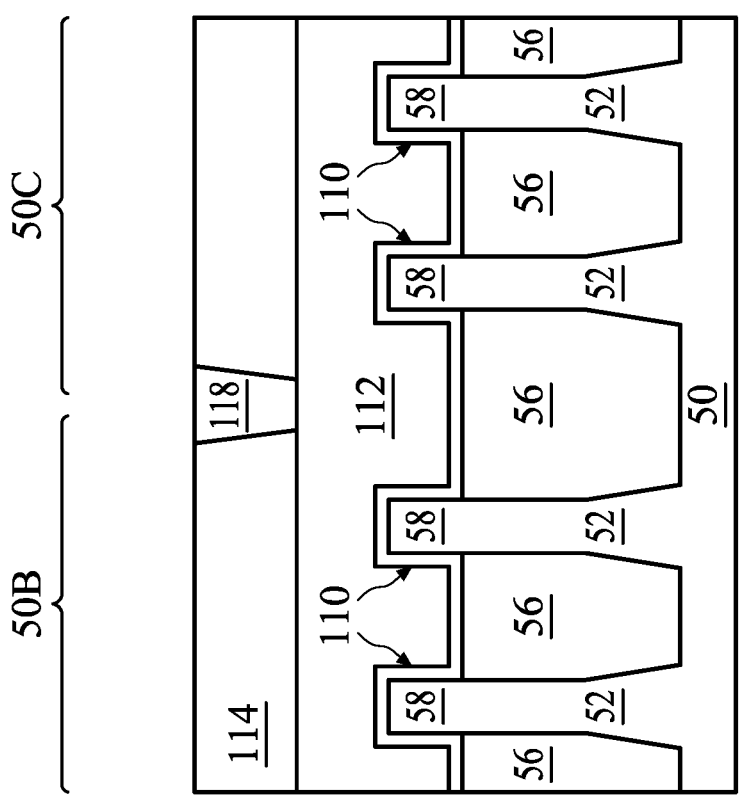
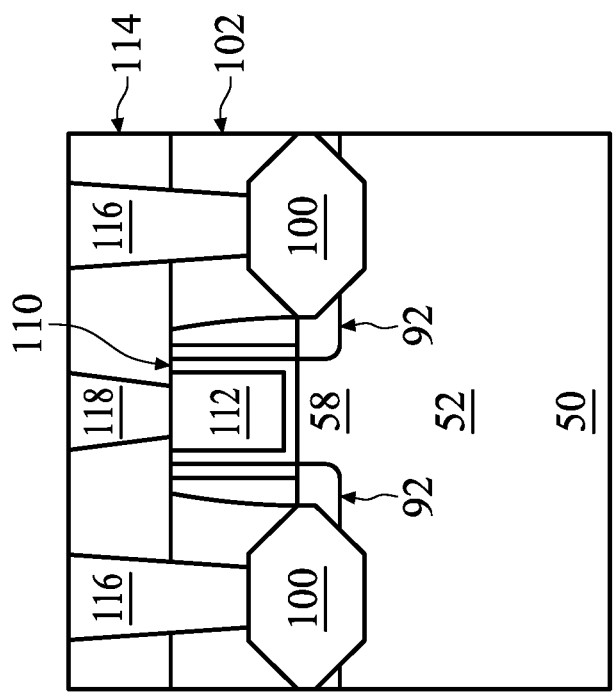
Figure 22A
Figure 22B

SEMICONDUCTOR DEVICE AND METHOD

PRIORITY CLAIM AND CROSS-REFERENCE

This application is a continuation of U.S. patent application Ser. No. 16/908,305 filed Jun. 22, 2020 and entitled "Semiconductor Device and Method," which application is a continuation of U.S. patent application Ser. No. 15/816,259 filed Nov. 17, 2017 and entitled "Semiconductor Device and Method," now U.S. Pat. No. 10,700,197 issued on Jun. 30, 2020, which application claims the benefit of the provisionally filed U.S. Patent Application No. 62/565,752, filed Sep. 29, 2017, and entitled "Semiconductor Device and Method," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, and 10C are cross-sectional views of intermediate stages in the manufacturing of FinFETs, in accordance with some embodiments.

FIGS. 12A, 12B, 12C, 13A, 13B, 13C, 14A, 14B, 15A, 15B, 16A, 16B, 16C, 16D, 17A, 17B, 18A, 18B, 19A, 19B, 20A, 20B, 21A, 21B, 22A, and 22B are cross-sectional views of intermediate stages in the manufacturing of FinFETs, in accordance with some embodiments.

DETAILED DESCRIPTION

Figure 1:
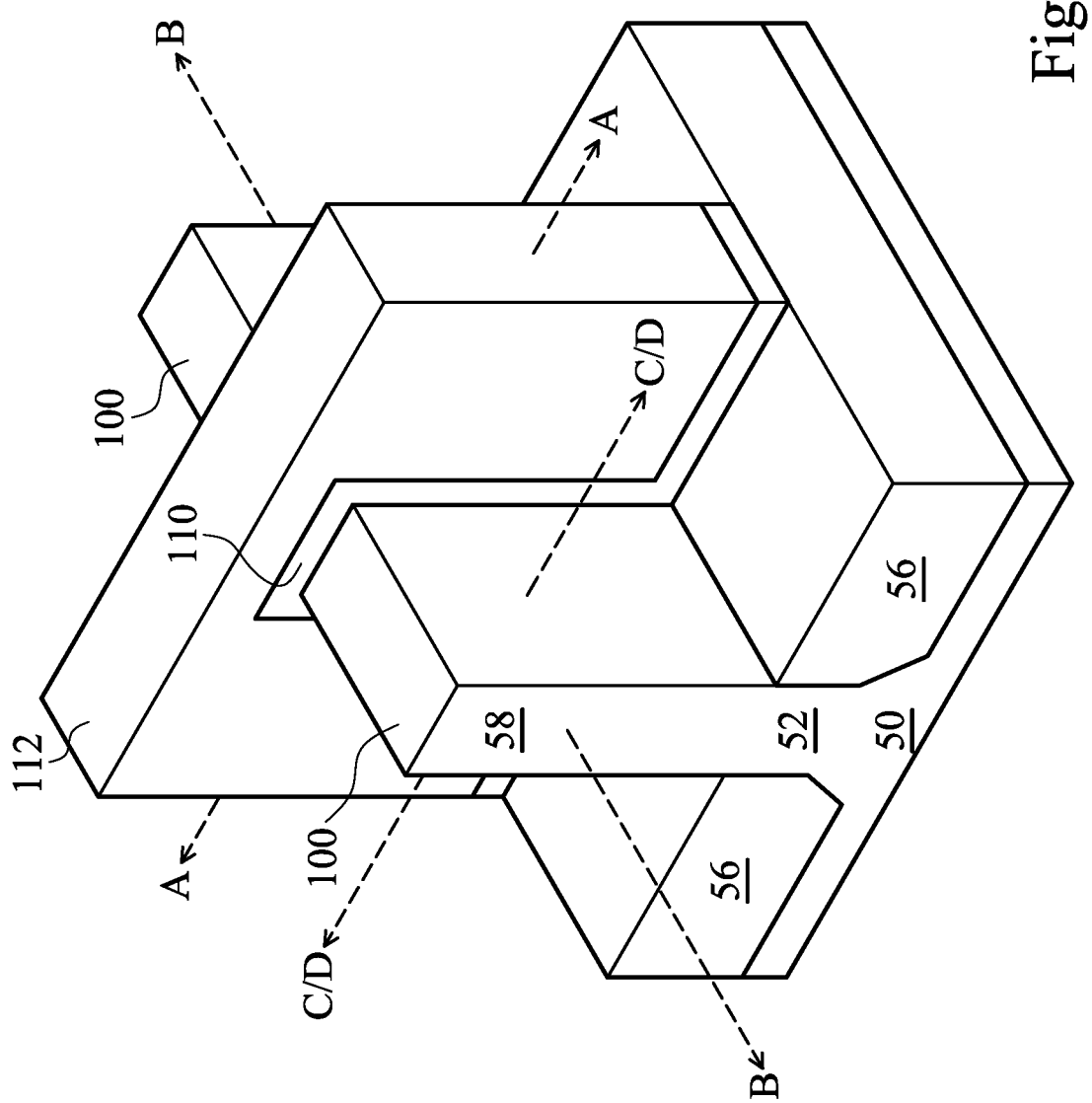
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a spacer layer is formed over FinFETs in a first region and a second region of a substrate. The second region is covered with a mask, and the spacer layer in the first region is doped with a first dopant (e.g., a p-type dopant, such as boron) in a plasma doping process. An anneal process is then performed to drive the dopants into the fins in the first region, thereby forming lightly doped drain/source (LDD) regions in the fins in the first region. A source/drain region is epitaxially grown in the fins in the first region. Forming the LDD regions with a plasma doping process may increase the concentration of dopants in sidewalls of the fins that contact the epitaxial source/drain regions, thereby improving device performance and reliability.

FIG. 1 illustrates an example of a FinFET in a three-dimensional view, in accordance with some embodiments. The FinFET comprises a fin 58 on a substrate 50. Isolation regions 56 are formed on the substrate 50, and the fin 58 protrudes above and from between neighboring isolation regions 56. A gate dielectric layer 110 is along sidewalls and over a top surface of the fin 58, and a gate electrode 112 is over the gate dielectric layer 110. Source/drain regions 100 are disposed in opposite sides of the fin 58 with respect to the gate dielectric layer 110 and gate electrode 112. FIG. 1 further illustrates reference cross-sections that are used in later figures. Cross-section A-A is across a channel, gate dielectric layer 110, and gate electrode 112 of the FinFET. Cross-section B-B is perpendicular to cross-section A-A and is along a longitudinal axis of the fin 58 and in a direction of, for example, a current flow between the source/drain regions 100. Cross-section C-C is parallel to cross-section B-B and extends through a source/drain region of the FinFET Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 10C and 12A through 22B are cross-sectional views of intermediate stages in the manufacturing of FinFETs, in accordance with some embodiments. FIGS. 2 through 5 illustrate reference cross-section A-A illustrated in FIG. 1, except for multiple fins/FinFETs. In FIGS. 6A through 10C and 12A through 22B, figures ending with an "A" designation are illustrated along reference cross-section A-A illustrated in FIG. 1, figures ending with a "B" designation are illustrated along a similar cross-section B-B illustrated in FIG. 1, and figures ending with a "C" or "D" designation are illustrated along a similar cross-section C/D-C/D illustrated in FIG. 1, except for multiple fins/FinFETs.

Figure 2:
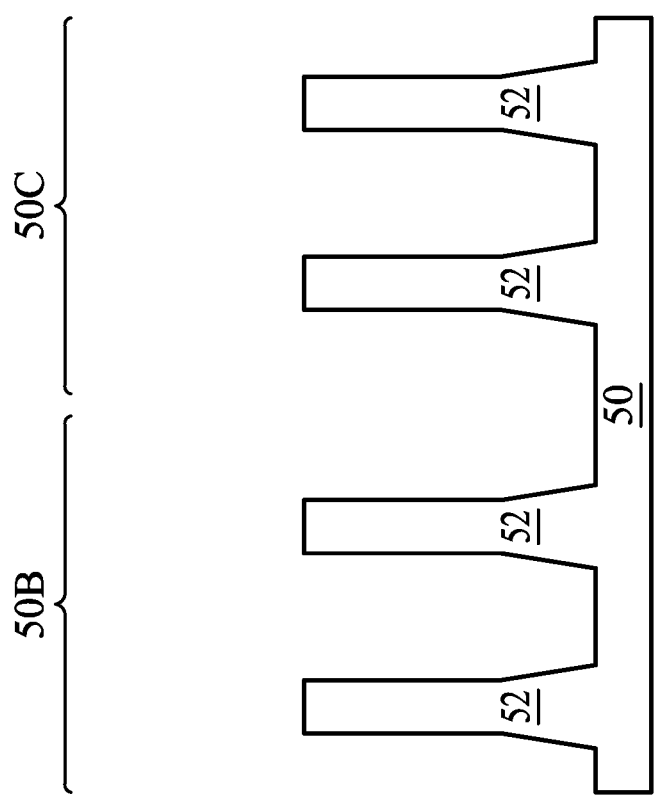

In FIG. 2, fins 52 are formed in a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by a divider), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 3:
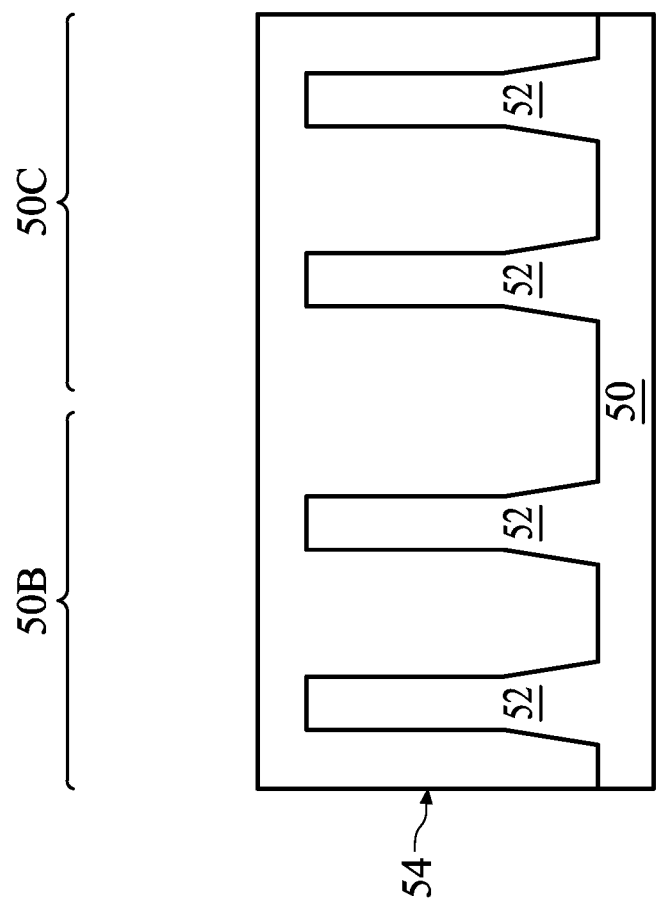

In FIG. 3, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 4:
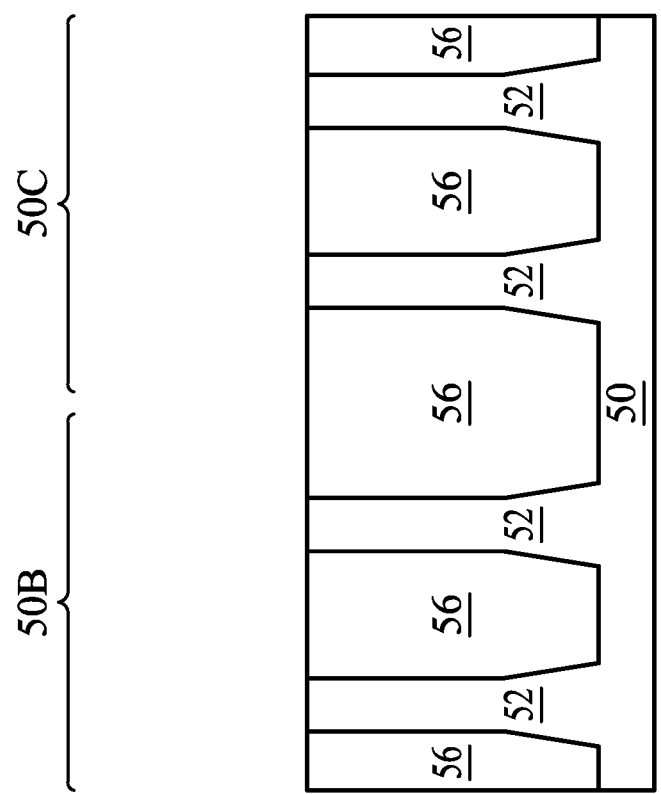

In FIG. 4, a planarization process is applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

In FIG. 5, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 4 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 5, appropriate doped regions (not shown) may be formed in the fins 58, the fins 52, and/or the substrate 50. In some embodiments, a P-type doped region may be formed in the region 50B, and an N-type doped region may be formed in the region 50C. In some embodiments, only P-type or only N-type doped regions are formed in both the region 50B and the region 50C.

In the embodiments with different types of doped regions, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF2, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

FIGS. 6A through 10C and 12A through 22B illustrate various additional steps in the manufacturing of embodiment devices. In particular, FIGS. 6A through 10C and 12A through 22B illustrate various additional steps in the manufacturing of p-type devices, such as PMOS transistors, e.g., p-type FinFETs. As such, the figures ending with a "B" designation illustrate the cross-section B-B of FIG. 1 for fins in in the region 50C.

Figure 6A:
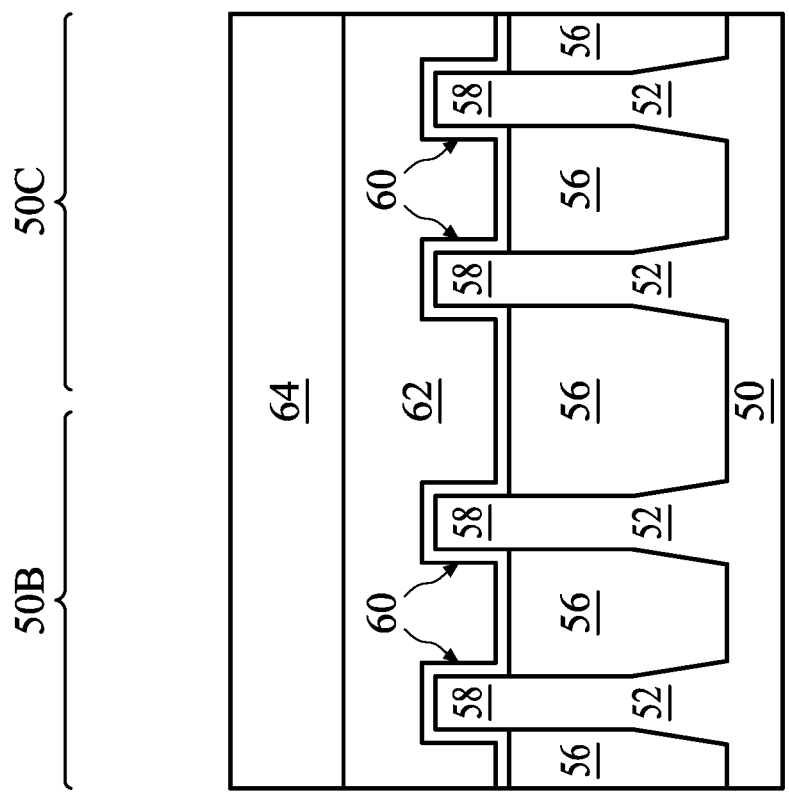
Figure 6C:
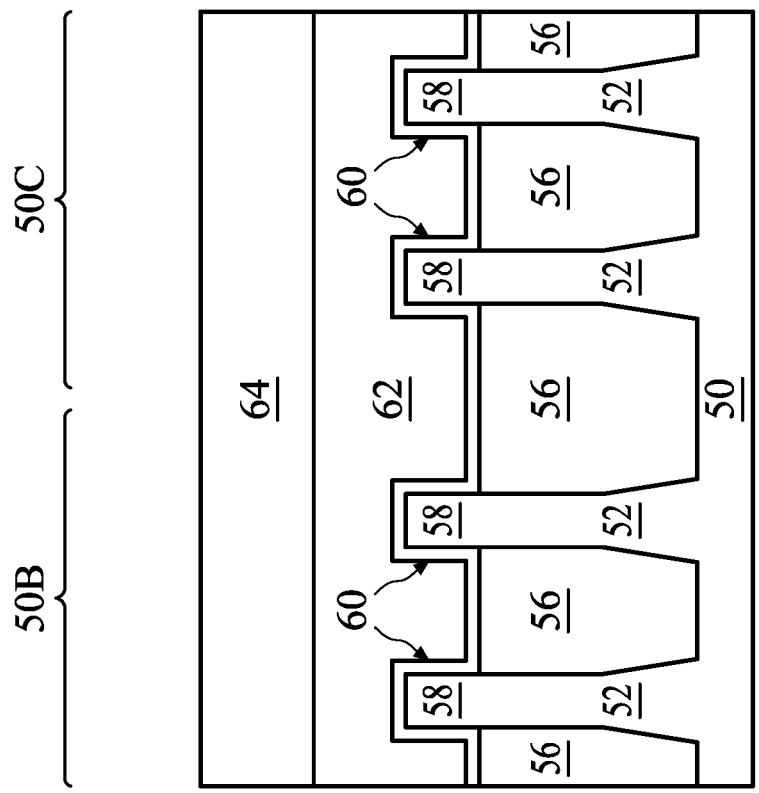
Figure 6B:
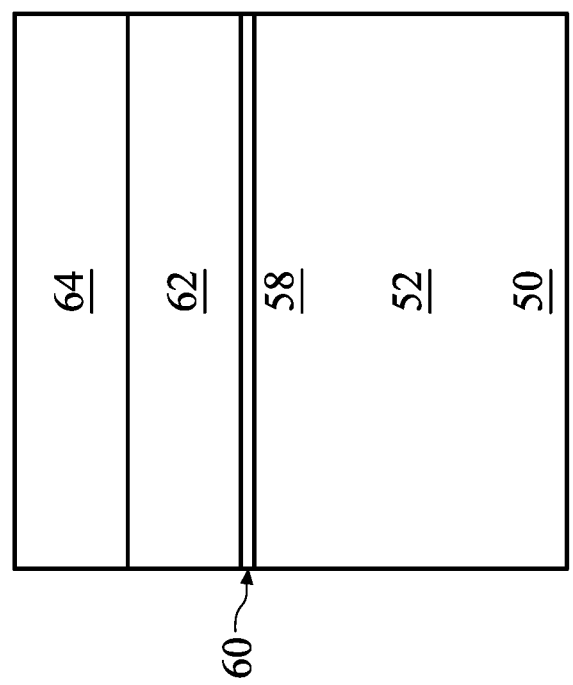

In FIGS. 6A, 6B, and 6C, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may be deposited over the dummy gate layer 62. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

Figure 7A:
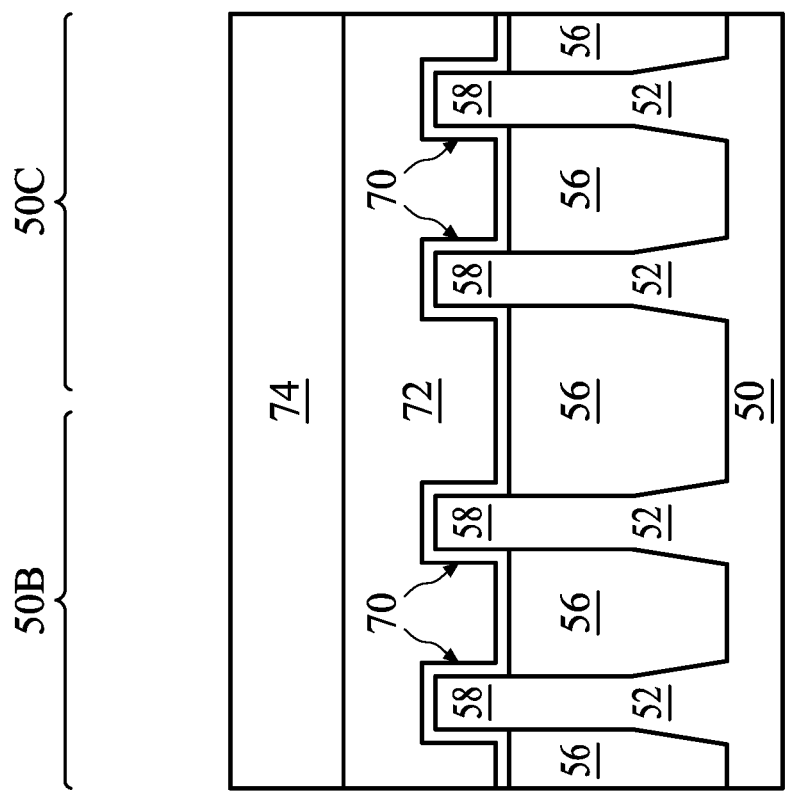
Figure 7C:
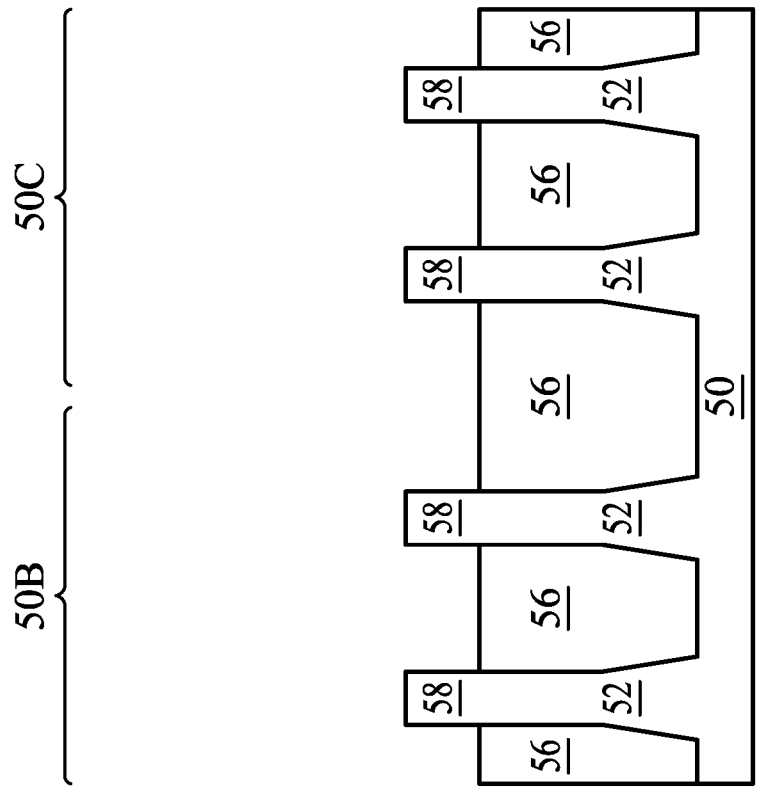
Figure 7B:
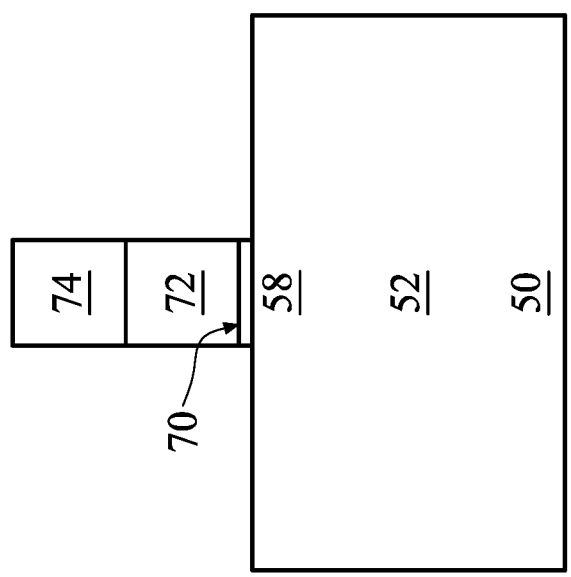

In FIGS. 7A, 7B, and 7C, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72 and dummy gate dielectrics 70, respectively. The dummy gates 72 and dummy gate dielectrics 70 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins.

Figure 8A:
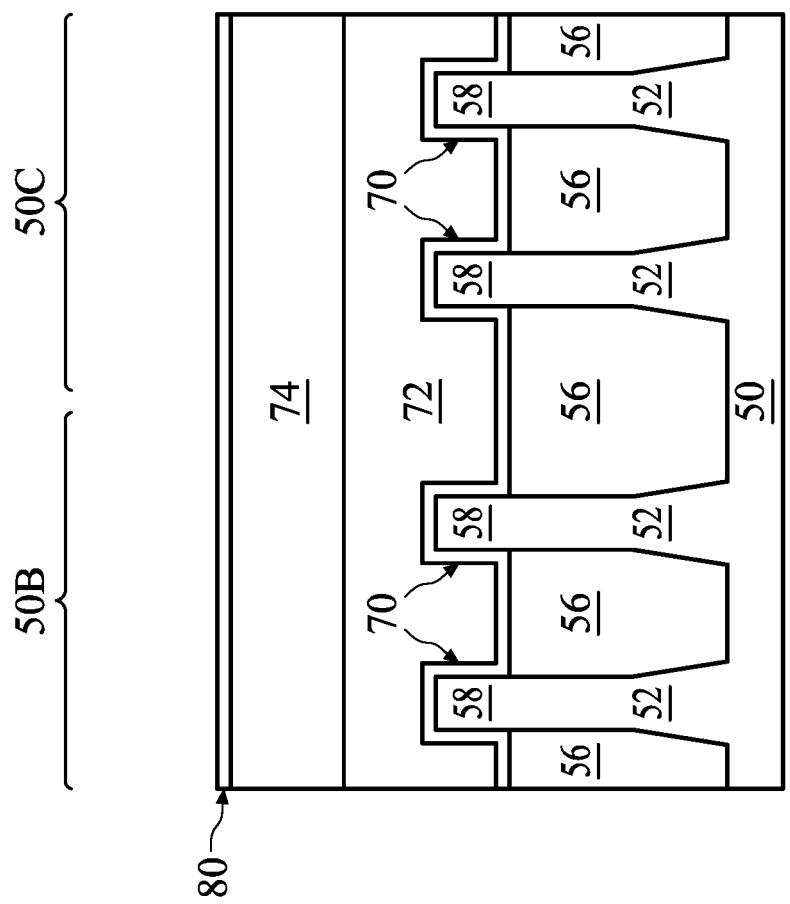
Figure 8C:
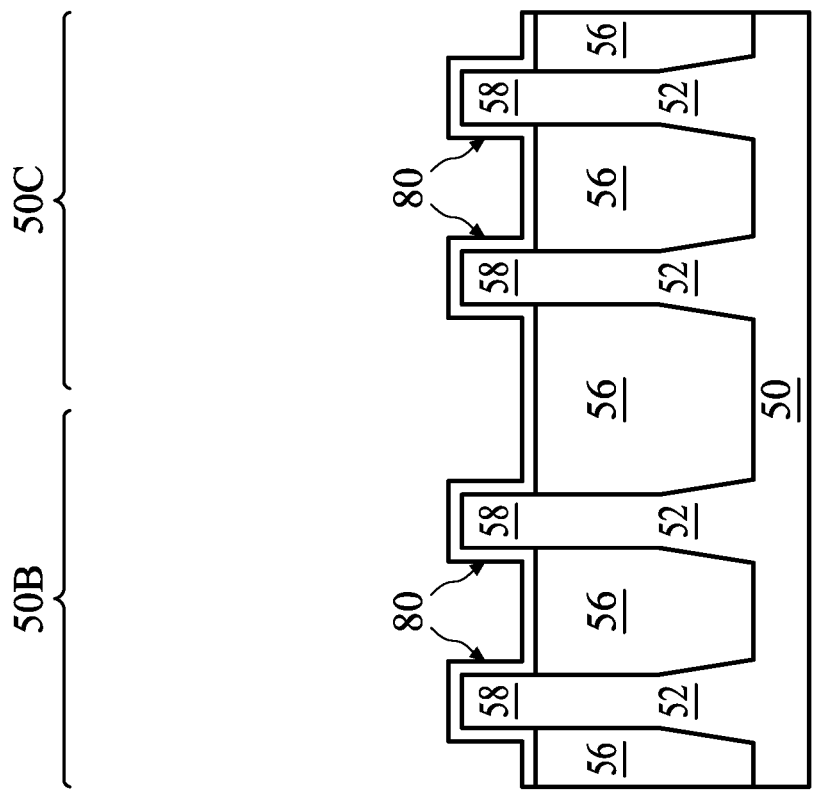
Figure 8B:
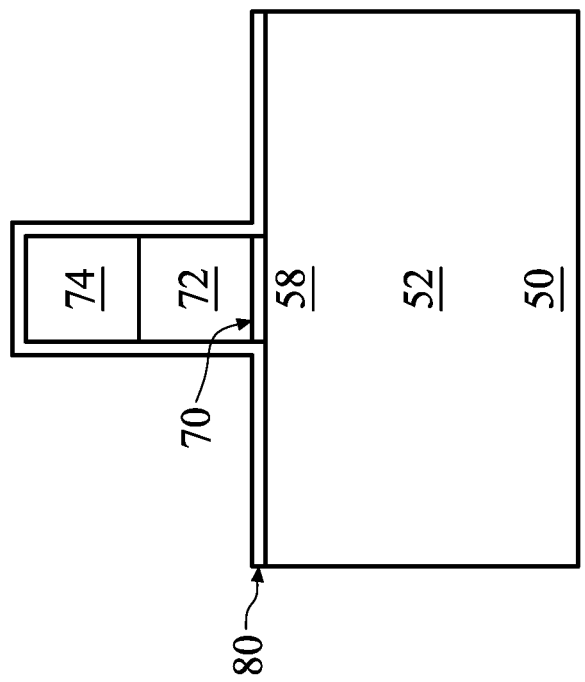

In FIGS. 8A, 8B, and 8C, a gate seal spacer layer 80 is formed on exposed surfaces of the masks 74, the dummy gates 72, the dummy gate dielectrics 70, the fins 58, and/or the STI regions 56. A thermal oxidation or a deposition process may be used to form the gate seal spacer layer 80, which may have a thickness of from about 35 angstrom to about 45 angstrom, such as about 43 angstroms. In embodiments where a deposition process is used, the gate seal spacer layer 80 may extend along top surfaces of the STI regions 56 between the fins 58. In some embodiments, the gate seal spacer layer 80 may be formed of a nitride, such as silicon nitride, silicon oxynitride, silicon carbide, silicon carbonitride, the like, or a combination thereof.

Figure 9A:
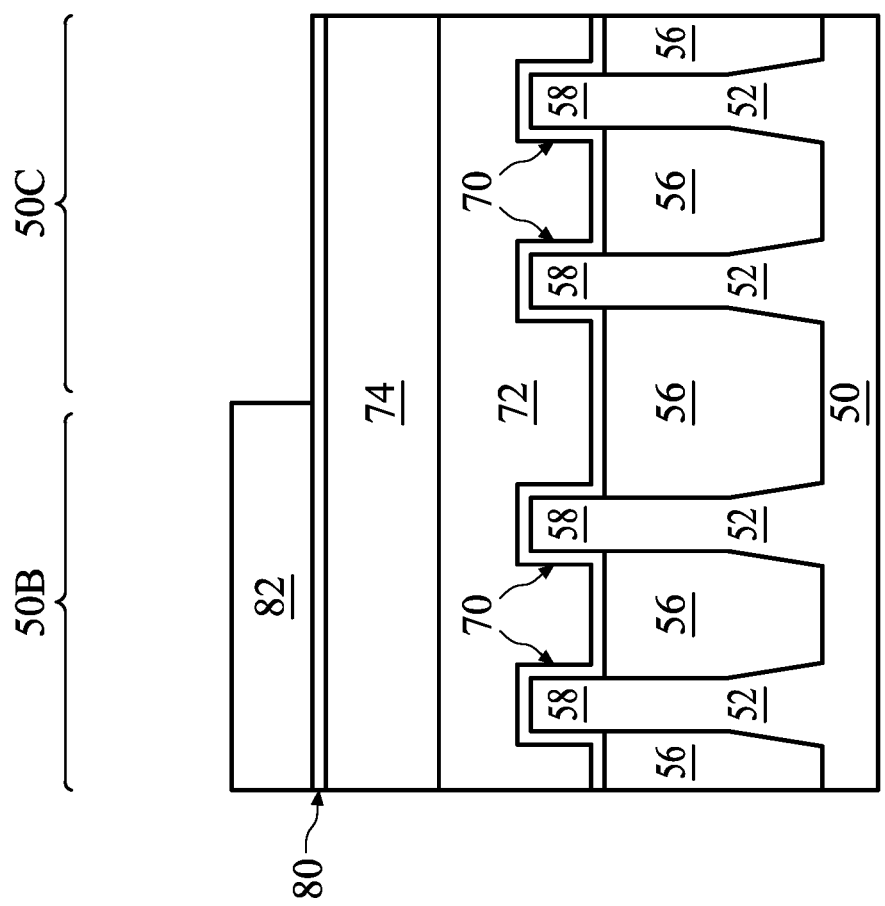
Figure 9C:
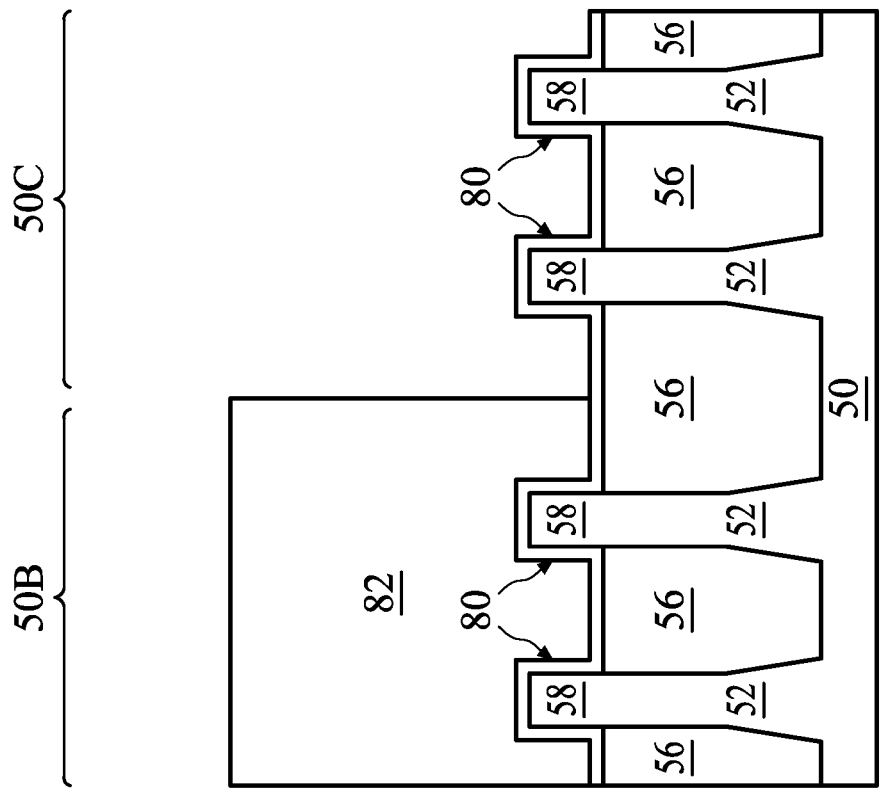
Figure 9B:
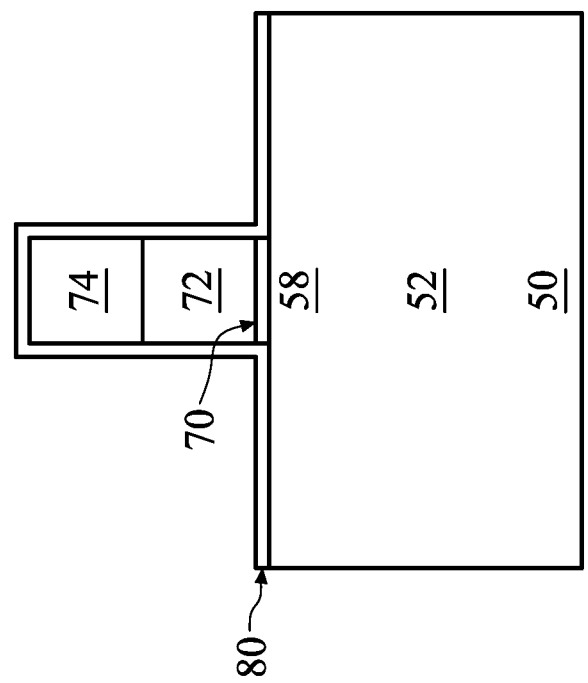

In FIGS. 9A, 9B, and 9C, a mask 82 is formed to cover the fins 58 in the region 50B. The mask 82 may be formed by forming, e.g., a photoresist, over the gate seal spacer layer 80, the masks 74, the dummy gates 72, the dummy gate dielectrics 70, the fins 58, and/the STI regions 56. The photoresist may be a suitable photoresist, such as a single-layer photoresist, a tri-layer photoresist, or the like, and may be formed by a spin-on technique or the like. The photoresist is then patterned using acceptable photolithography techniques to expose the region 50C (e.g., the PMOS region) while the region 50B (e.g., the NMOS region) remains covered.

Figure 10A:
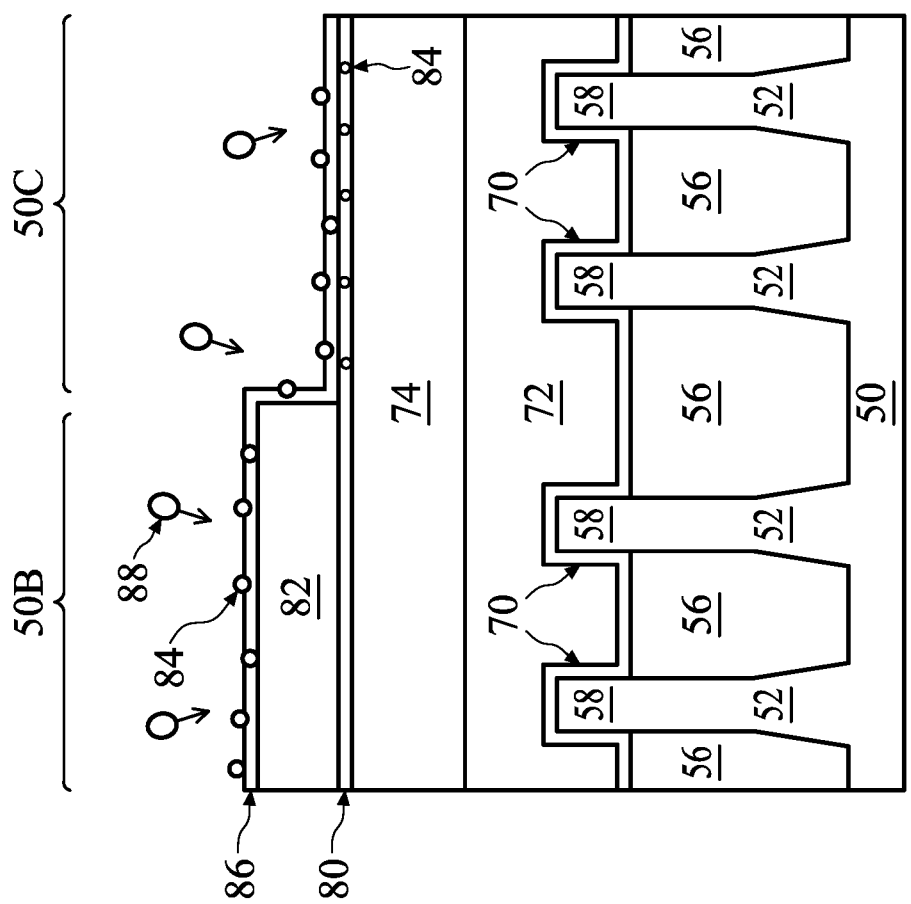
Figure 10C:
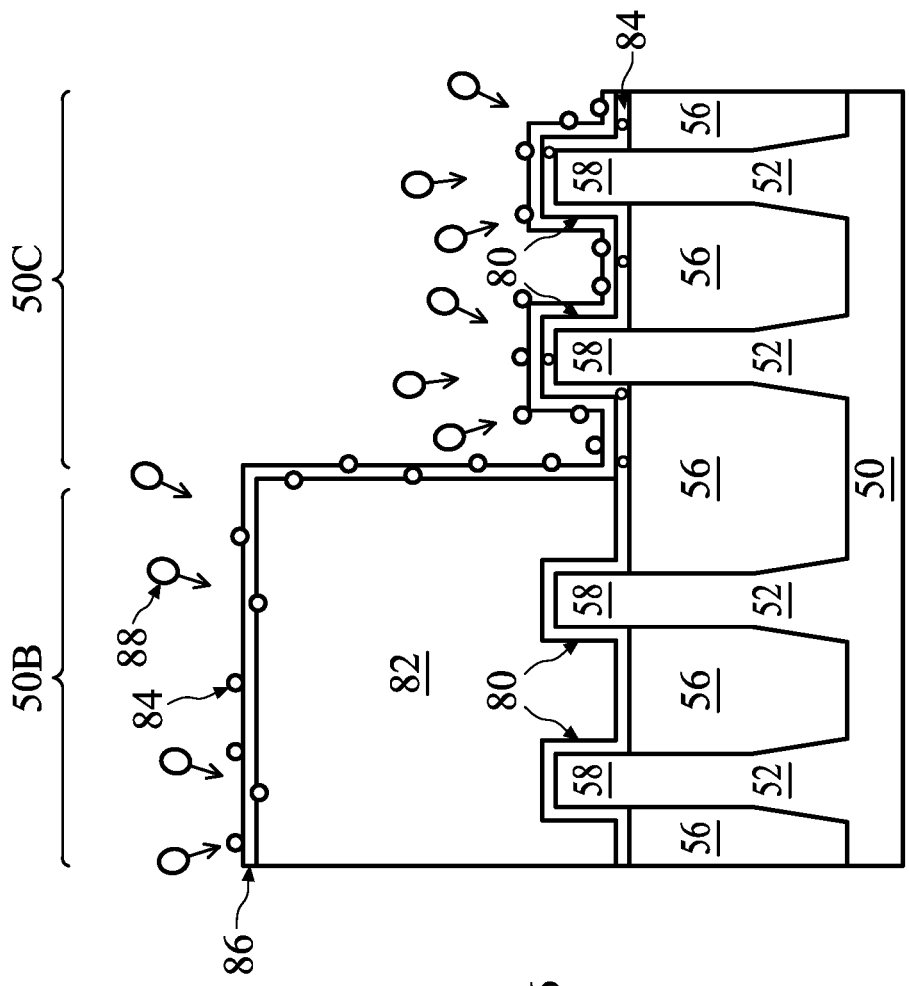
Figure 10B:
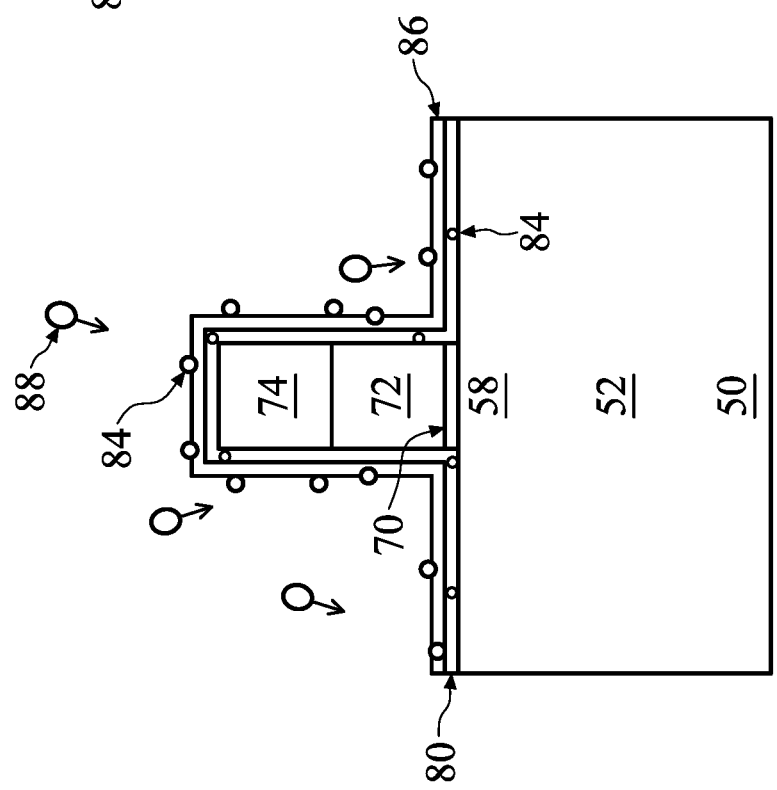

In FIGS. 10A, 10B, and 10C, a plasma doping process is performed to implant dopants into the gate seal spacer layer 80 and form a dopant layer 86 on the gate seal spacer layer 80. In the illustrated embodiment, a P-type dopant is used in the plasma doping process to dope the gate seal spacer layer 80 in the region 50C (e.g., the PMOS region) while the mask 82 shields the region 50B (e.g., the NMOS region) from the plasma doping process. Doping the gate seal spacer layer 80 with a P-type dopant may allow the fins 58 to be doped with P-type dopants in subsequent steps, improving the doping profile of the fins 58 for p-type devices when subsequently formed source/drain regions are in-situ doped during epitaxial growth.

The plasma doping process may be performed as part of a CVD process such as RF CVD, plasma-enhanced CVD (PECVD), or the like. The plasma doping process uses a gas source including a first precursor gas, a second precursor gas, and an inert gas. The first precursor gas comprises a dopant, such as a P-type dopant, such as boron, aluminium, nitrogen, gallium, indium, the like, or combinations thereof. The second precursor gas may comprise any gas that reacts with the first precursor gas to perform a suitable CVD process. The inert gas may comprise xenon, helium, argon, neon, krypton, radon, the like, or combinations thereof. In an embodiment, the P-type dopant is boron; in such embodiments, the first precursor gas may be a gaseous boron source such as $B_2H_6$ or the like, the second precursor gas is $H_2$, and the inert gas is argon.

Figure 11:
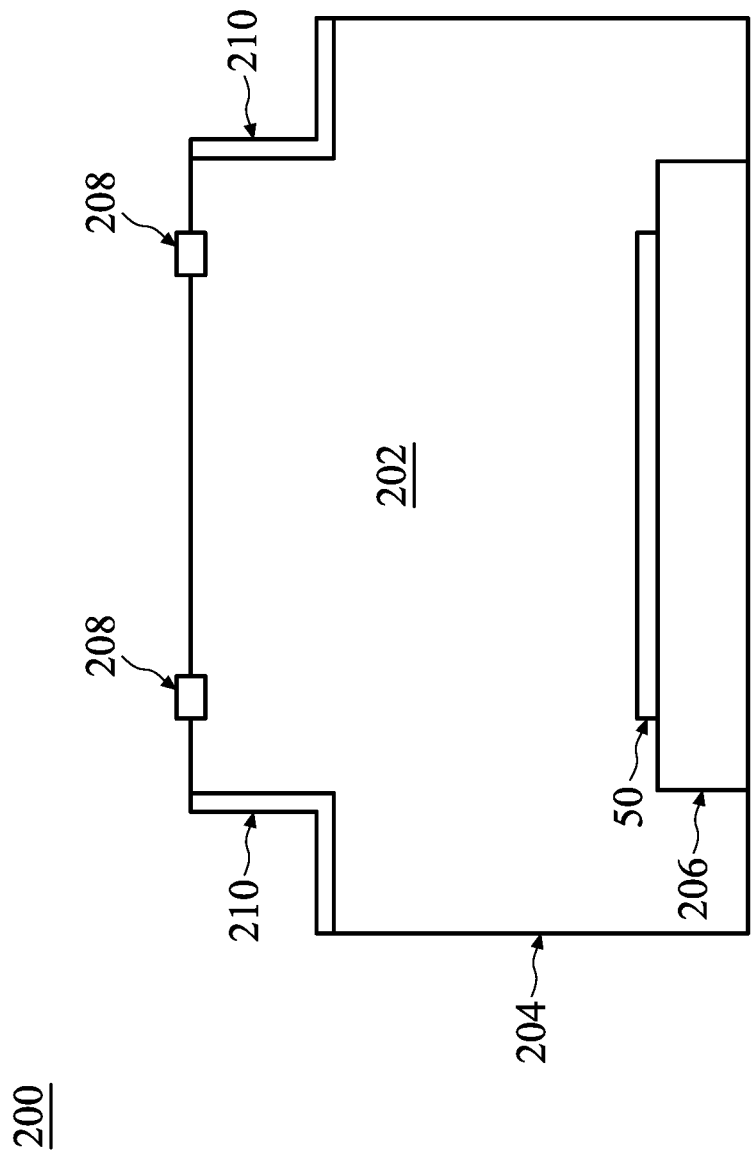
FIG. 11 illustrates a deposition system, in accordance with some embodiments.

FIG. 11 illustrates a deposition system 200, in accordance with some embodiments. The deposition system 200 may be used to implant the dopants into the gate seal spacer layer 80 and form the dopant layer 86 on the gate seal spacer layer 80. The deposition system 200 includes a chamber 202 defined by a housing 204. A chuck 206 in the chamber 202 holds a wafer, such as a wafer including the substrate 50. Gas inlets 208 provide precursor gasses to the chamber 202. A plasma generator 210 generates plasma from the precursor gasses; the plasma generator 210 may be a transformer-coupled plasma generator, inductively coupled plasma system, magnetically enhanced reactive ion etching system, electron cyclotron resonance system, a remote plasma generator, or the like. During the plasma doping process, the deposition system 200 performs discharge and implantation in alternating repeating steps or pulses. The discharge steps form the dopant layer 86 on the gate seal spacer layer 80 in a manner similar to a CVD process, and the implanting steps implant the dopants into the gate seal spacer layer 80.

During the discharge steps, a dopant layer 86 (shown in FIGS. 10A through 10C) of the P-type dopant is formed on the gate seal spacer layer 80. A gas source including the first precursor gas, second precursor gas, and inert gas is provided to the chamber 202 through the gas inlets 208. In embodiments where boron doping is performed, the gas source comprises from about 5% to about 15% of the first (e.g., boron-containing) precursor gas, from about 30% to about 85% of the second (e.g., $H_2$ containing) precursor gas, and from about 33% to about 66% of the inert (e.g., argon-containing) gas. In such embodiments, the first precursor gas is provided at a flow rate of from about 30 standard cubic centimeter per minute (sccm) to about 150 sccm; the second precursor gas is provided at a flow rate of less than about 170 sccm; and the inert gas is provided at a flow rate of less than about 170 sccm. The plasma generator 210 generates RF power that produces a plasma sheath in the chamber 202 from the gas source. In embodiments where boron is implanted, the plasma generator 210 generates RF power of from about 300 to about 1000 watts, and the generated plasma includes boron ions such as $B_2H_5^+$, $BH_3^+$, $B^+$, and the like. The ions descend to the surface of the wafer or substrate 50, where they are neutralized by free electrons to produce the dopant layer 86. In embodiments where boron doping is performed, the dopant layer 86 is a layer of boron, and a thickness of the dopant layer 86 may be from about 2 nm to about 6 nm, such as about 2 nm.

During the implanting steps, dopant particles 84 (e.g., boron) are driven into the into the gate seal spacer layer 80. A DC bias voltage is generated between the plasma generator 210 and the chuck 206. The DC bias voltage is a high-voltage negative offset and is pulsed periodically such that the implanting step is performed periodically. The dopant particles 84 (e.g., boron ions) are accelerated across the plasma sheath by the DC bias voltage and implanted into the gate seal spacer layer 80. Inert gas particles 88 (e.g., argon) may collide with the dopant particles 84 and knock the dopant particles 84 deeper into the gate seal spacer layer 80. For example, the inert gas particles 88 may knock the dopant particles 84 through the formed dopant layer 86 and into the gate seal spacer layer 80 in the region 50C (e.g., the PMOS region). In embodiments where boron doping is performed, the DC bias voltage may be from about −0.2 V to about −10 kV, may be pulsed for a period of from about 20 μs to about 100 μs, and may be pulsed at a frequency of from about 0.5 kHz to about 10 kHz. In such embodiments, the resulting implantation energy of boron may be from about 0.1 KV to about 3 KV, and a dosage of the implanted boron may be from about 1E15 atoms/cm$^3$ to about 5E16 atoms/cm$^3$.

The gate seal spacer layer 80 may have a graded concentration of the dopant particles 84, decreasing along a direction extending from the upper surfaces of the gate seal spacer layer 80 toward the lower/inner boundaries of the gate seal spacer layer 80. The dopant particles 84 may also enter the mask 82, which is removed in subsequent processing (discussed below). Thus, the mask 82 shields the region 50B (e.g., the NMOS region) from the plasma doping process.

Figure 12A:
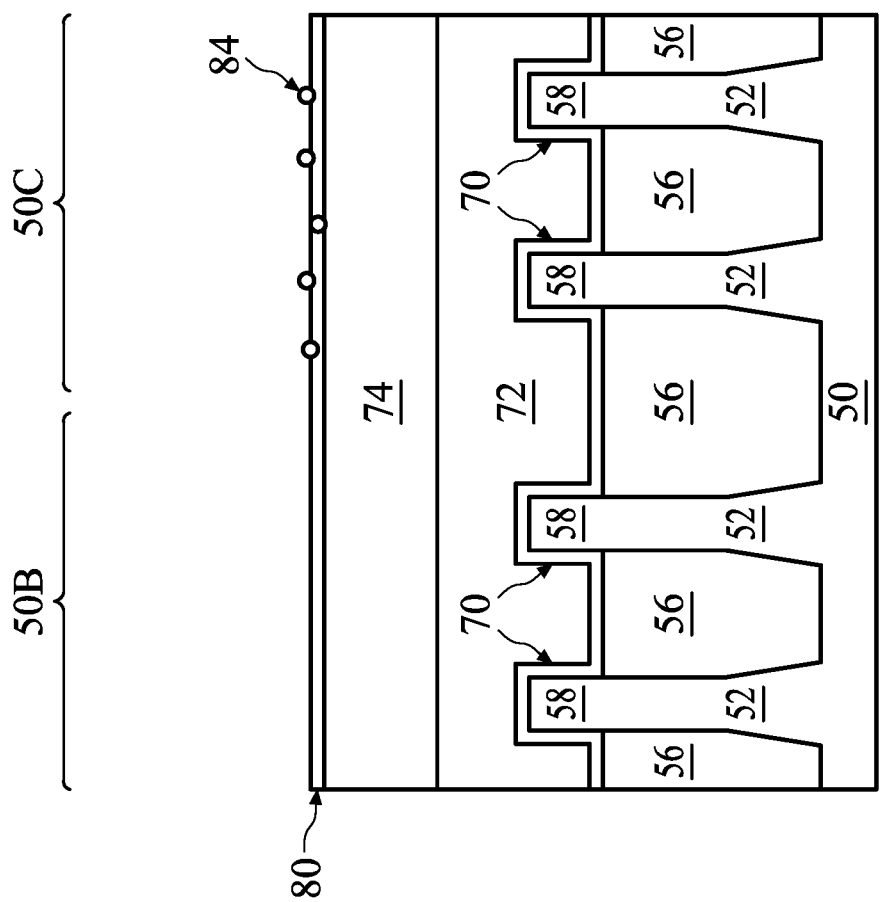
Figure 12C:
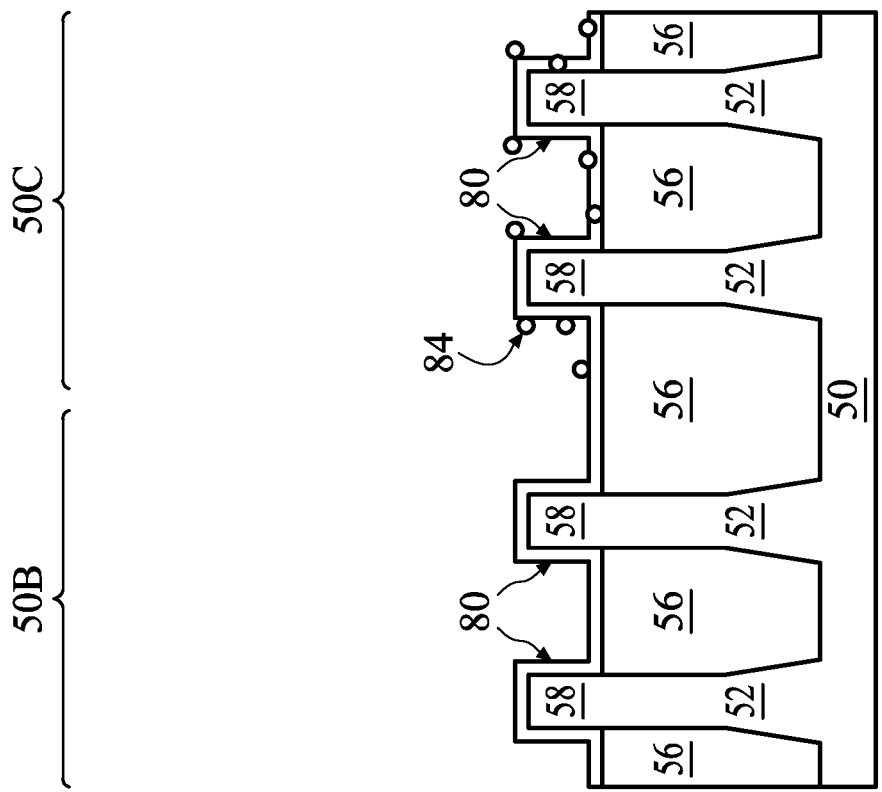
Figure 12B:
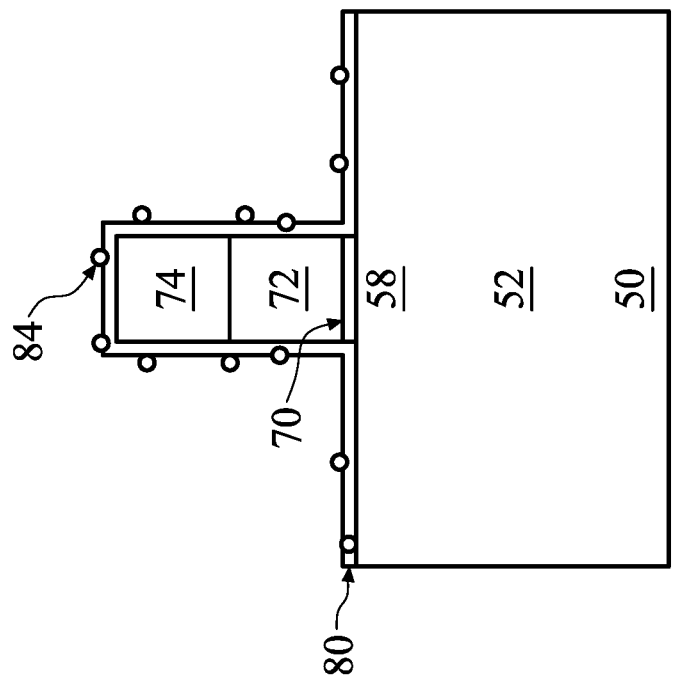

In FIGS. 12A, 12B, and 12C, the mask 82 is removed. The mask 82 may be remove by a suitable etching process, such as a wet etch process. In some embodiments, a wet etch process is performed using Sulfuric Peroxide Mixture (SPM), which is an acid comprising $H_2SO_4$, and $H_2O_2$. The SPM may further comprise an SC-1 cleaning solution, which is a mixture of $NH_4OH$, $H_2O_2$ and deionized water. The SPM has an etch selectivity between the mask 82 and the gate seal spacer layer 80, such that the SPM removes mask 82 without substantially attacking the gate seal spacer layer 80. The wet etch process conditions (e.g., time, temperature) are controlled such that the wet etch process removes the mask 82 and the dopant layer 86 without substantially removing the dopant particles 84 (e.g., boron) embedded in the gate seal spacer layer 80 in the region 50C (e.g., the PMOS region). In an embodiment, a wet etch process is performed for a time interval of from about 30 seconds to about 120 seconds, using a high temperature SPM solution at a temperature of from about 150° C. to about 180° C.

The time and the temperature of the wet etch process using SPM may be tuned to work with the implantation energy (e.g., from about 0.5 KV to about 3 KV) to reduce silicon loss (e.g., fin height loss) and to improve the on-current $I_{on}$ of the formed semiconductor devices. For example, the wet etch process discussed above may result in little or no fin height loss (e.g., 0 nm to about 1 nm) and less than 2% reduction of the on-current $I_{on}$ of the semiconductor devices. Longer wet etch processes (e.g., more than 120 seconds) or higher implantation energy levels (e.g., greater than 3 KV) may result in 3 nm or more of fin height loss, which may result in an about 6% degradation in the on-current $I_{on}$ of the semiconductor devices. Shorter wet etch processes (e.g., less than about 30 seconds), on the other hand, may not remove all of the mask 82 and gate seal spacer layer 80.

Figure 13A:
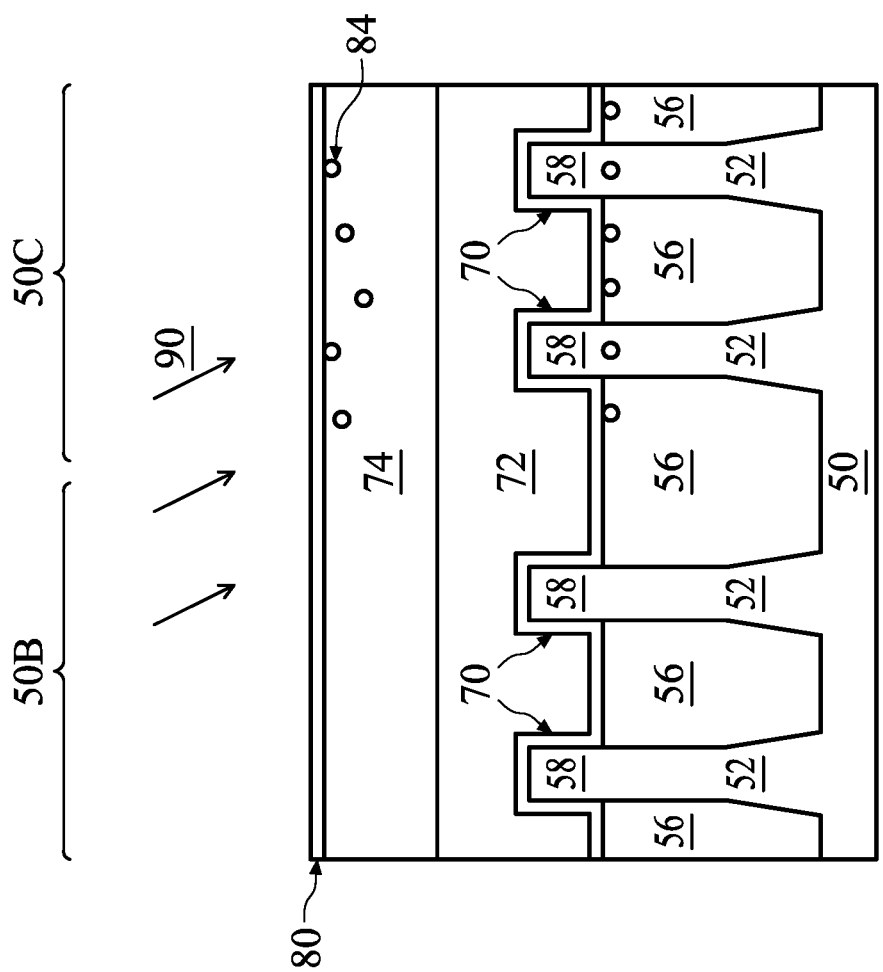
Figure 13C:
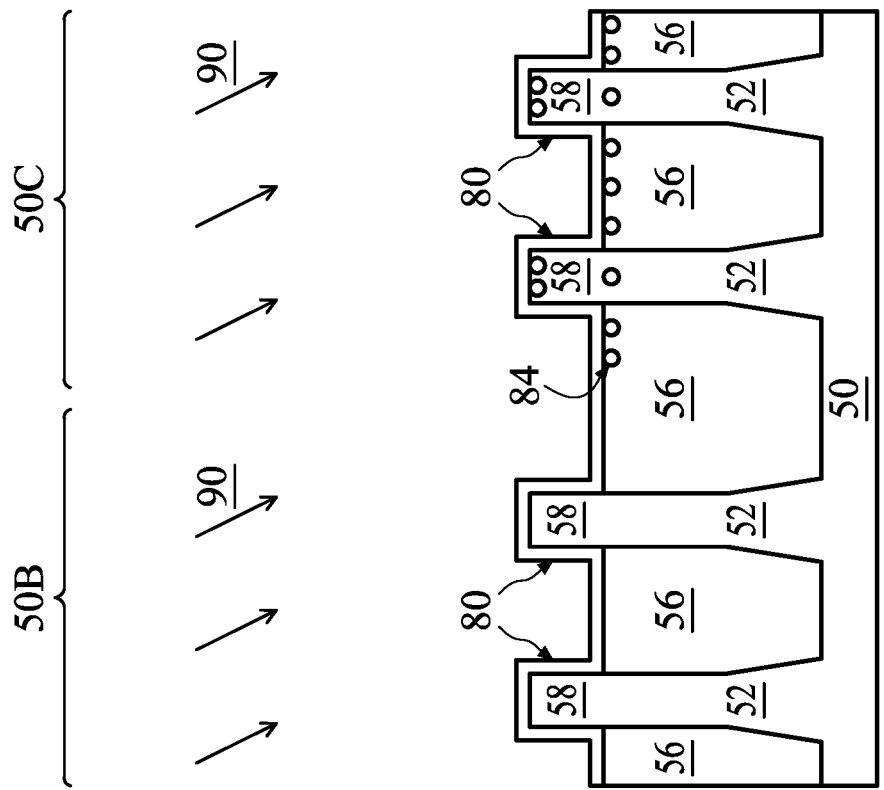
Figure 13B:
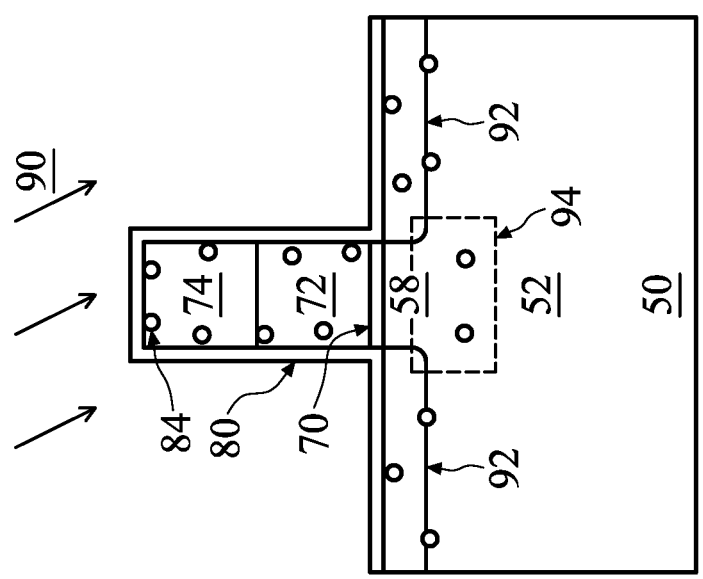

In FIGS. 13A, 13B, and 13C, an anneal process 90 is performed to drive the dopant particles 84 embedded in the gate seal spacer layer 80 into fins 58 in the region 50C (e.g., the PMOS region), thereby forming lightly doped drain/source (LDD) regions 92 in the fins 58. The anneal process 90 also activates the implanted dopants (e.g., boron). The anneal process 90 may be performed in a same chamber as the doping process, or may be performed in a different chamber than the chamber used in the doping process.

The high temperature of the anneal process 90 helps drive the dopant particles 84 into the corresponding fins 58. However, such high temperatures may also increase outgassing of the dopant (e.g., boron). Outgassing of the dopant may cause a lower concentration of the dopant in the LDD regions 92 that are formed in the fins 58 in the region 50C (e.g., the PMOS region). Outgassing may also pose a safety issue for the production tool. In some embodiments, oxygen (e.g., $O_2$) is introduced to the ambient environment of the anneal process 90, which may reduce outgassing of the dopants. The $O_2$ may react with (e.g., oxidize) the dopants (e.g., boron) at the surface of the fins 58 in the region 50C (e.g., the PMOS region), thereby forming a oxide film (e.g., an oxide of the surface materials, such as silicon, boron, and the like) (not shown) over the fins 58. The oxide film may prevent or reduce outgassing of boron from the LDD regions

92 during the anneal process 90. In an embodiment, the anneal process 90 is a spike annealing process performed at a temperature of from about 950° C. to about 1050° C., for a time interval of from about 1 second to about 2 seconds, and in an ambient environment comprising from about 0% to about 10% of $O_2$ and from about 90% to about 100% of $N_2$.

The LDD regions 92 extend below the gate seal spacer layer 80 and abut the channel regions of the FinFET devices. The method described above for forming the LDD regions 92 may result in the LDD regions 92 having a graded dopant concentration along a vertical direction, e.g., the concentration decreases along a direction from the upper surfaces (or tops) of the LDD regions 92 to the lower boundaries (or bottoms) of the LDD regions 92 opposing the upper surfaces of the LDD regions 92. Further, the channel region may be substantially free of boron. Thus, because the channel region may be substantially free of boron, there may be a step change in the concentration of boron dopants at the interface between the LDD regions 92 and the channel regions. The choice of dopant, e.g., boron, may determine whether the change in dopant concentration at the interface is abrupt. The graded dopant concentration and the abrupt change of concentration along the interface between the LDD regions 92 and the channel region may reduce the internal resistance of the resulting FinFET devices. Additionally, some of the dopant particles 84 may migrate from the surface of the fins 58 to under the channel region. Thus, the two LDD regions 92 of each FinFET device may overlap and extend into a region 94, thereby forming a PMOS overlap region. Formation of the PMOS overlap region may reduce channel resistance and increase the turn-on current of the resulting FinFET devices, thereby improving the performance of the FinFET devices.

The anneal process 90 also causes the dopant particles 84 (e.g., boron) embedded in the gate seal spacer layer 80 to be driven into the masks 74, the dummy gates 72, the dummy gate dielectrics 70. However, in embodiments where the dummy gates 72 are replaced later by replacement gates, e.g., in the gate-last process described below, the dopant may not affect the performance of the replacement gates. In embodiments where a gate-first process is used, the dopant particles 84 in the gates may not adversely impact the performance of the resulting semiconductor devices, as the dosage of the implanted dopant (e.g., boron) is low. Similar to the LDD regions 92, the dummy gate dielectrics 70, dummy gates 72 and masks 74 may have a graded concentration of the dopant particles 84, decreasing along a direction extending from the outer surfaces of the dummy gate dielectrics 70, dummy gates 72 and masks 74 toward interior regions or surfaces of the same.

The anneal process 90 also causes the dopant particles 84 (e.g., boron) embedded in the gate seal spacer layer 80 to be driven into the STI regions 56. The dopant particles 84 may not affect the insulating properties of the STI regions 56. Similar to the LDD regions 92, the STI regions 56 may have a graded concentration of the dopant particles 84, decreasing along a direction extending from the upper surfaces (or tops) of the STI regions 56 toward the lower boundaries (or bottoms) of the STI regions 56.

Although the process described above with respect to FIGS. 9A through 13C is used to form the LDD regions 92 for fins 58 in the region 50C (e.g., the PMOS region) of the substrate 50, it should be appreciated that the process may be repeated to form LDD regions 92 for fins 58 in the region 50B (e.g., the NMOS region). For example, a photoresist may be deposited and patterned to expose the region 50B while covering the region 50C. A plasma doping process may be performed to implant an N-type dopant (e.g., arsenic) in the gate seal spacer layer 80 in the region 50B. A gas source for the plasma doping process may include arsenic (As) and an inert gas such as Xe, He, Ar, Ne, Kr, the like, or combinations thereof. The conditions (e.g., flow rate, implantation energy) for the plasma doping processing of the region 50B may be similar to that used in the region 50C, and thus details are not repeated. A wet etch process similar to the wet etch process for the region 50B may be performed to remove the photoresist and a deposited layer comprising the N-type dopant (e.g., arsenic); conditions (e.g., type of acid, temperature, time interval, etc.) of the wet etch process may be similar to those discussed above with reference to the region 50C, and thus details are not repeated. Next, an annealing process, which may be similar to the anneal process 90, may be performed to drive the N-type dopant into the fins 58 in the region 50B, and to activate the N-type dopant, thereby forming the LDD regions 92 for the fins 58 in the region 50B.

Figure 14B:
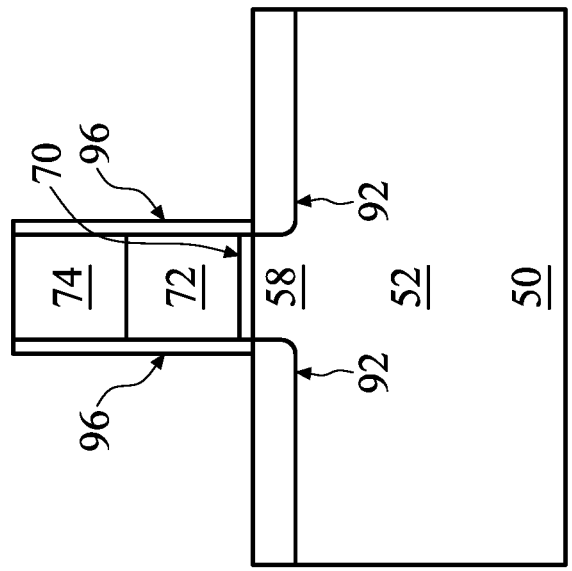
Figure 14A:
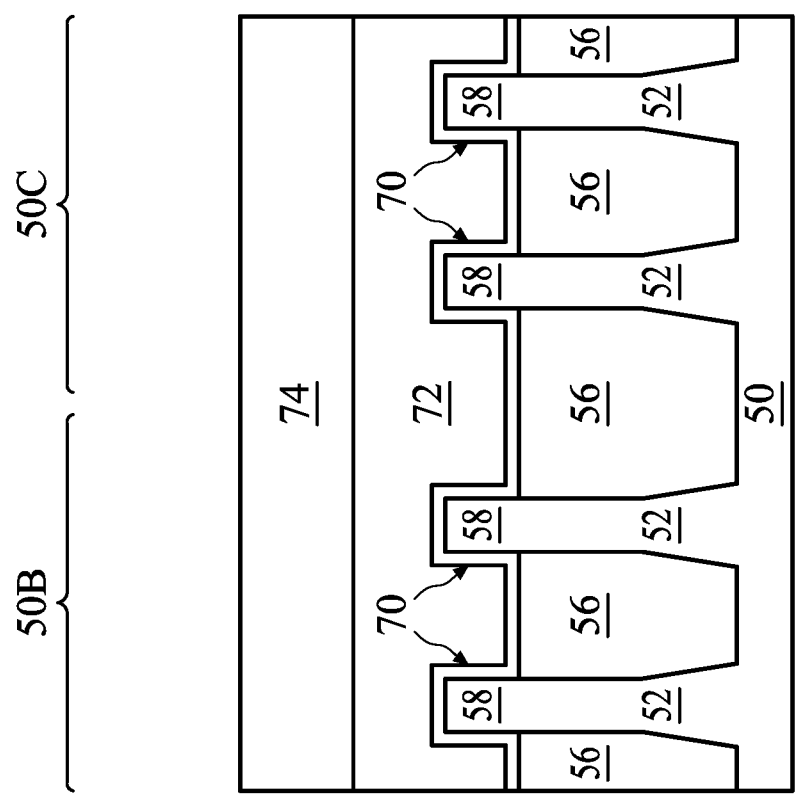

In FIGS. 14A and 14B, the gate seal spacer layer 80 is patterned to form gate seal spacers 96. The gate seal spacer layer 80 may be etched by, e.g., an anisotropic etch.

Figure 15B:
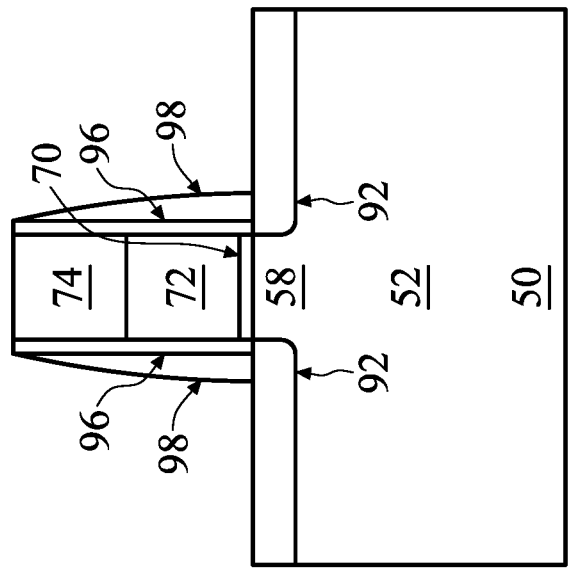
Figure 15A:
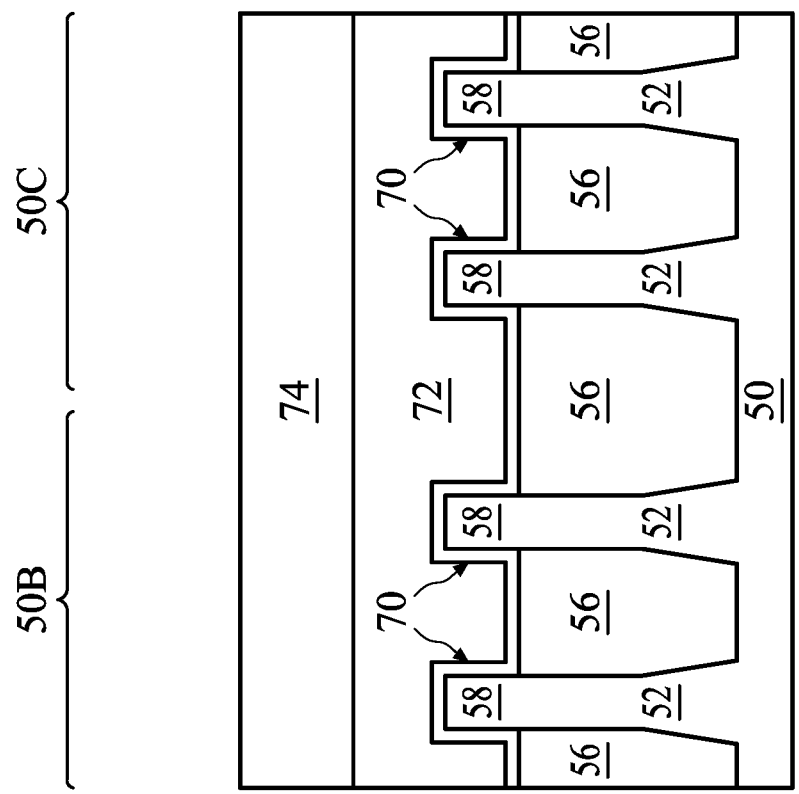

In FIGS. 15A and 15B, gate spacers 98 are formed on the gate seal spacers 96 along sidewalls of the dummy gates 72 and the masks 74. The gate spacers 98 may be formed by conformally depositing a material and subsequently anisotropically etching the material. The material of the gate spacers 98 may be silicon nitride, SiCN, a combination thereof, or the like. The etch may be selective to the material of the gate spacers 98, such that the epitaxial source/drain regions 100 are not etched during the formation of the gate spacers 98.

In FIGS. 16A, 16B, 16C, and 16D, epitaxial source/drain regions 100 are formed in the fins 58. The epitaxial source/drain regions 100 are formed in the fins 58 such that each dummy gate 72 is disposed between respective neighboring pairs of the epitaxial source/drain regions 100. In some embodiments, the epitaxial source/drain regions 100 may extend through the LDD regions 92. In some embodiments, the gate spacers 98 and gate seal spacers 96 are used to separate the epitaxial source/drain regions 100 from the dummy gates 72 by an appropriate lateral distance so that the epitaxial source/drain regions 100 do not short out subsequently formed gates of the resulting FinFETs.

The epitaxial source/drain regions 100 in the region 50B, e.g., the NMOS region, may be formed by masking the region 50C, e.g., the PMOS region, and etching source/drain regions of the fins 58 in the region 50B to form recesses in the fins 58. Then, the epitaxial source/drain regions 100 in the region 50B are epitaxially grown in the recesses. The epitaxial source/drain regions 100 may include any acceptable material, such as appropriate for n-type FinFETs. For example, if the fins 58 are silicon, the epitaxial source/drain regions 100 in the region 50B may include silicon, SiC, SiCP, SiP, or the like. The epitaxial source/drain regions 100 in the region 50B may have surfaces raised from respective surfaces of the fins 58 and may have facets.

The epitaxial source/drain regions 100 in the region 50C, e.g., the PMOS region, may be formed by masking the region 50B, e.g., the NMOS region, and etching source/drain regions of the fins 58 in the region 50C to form recesses in the fins 58. Then, the epitaxial source/drain regions 100 in the region 50C are epitaxially grown in the recesses. The epitaxial source/drain regions 100 may include any acceptable material, such as appropriate for p-type FinFETs. For example, if the fins 58 are silicon, the epitaxial source/drain regions 100 in the region 50C may comprise SiGe, SiGeB, Ge, GeSn, or the like. The epitaxial source/drain regions 100 in the region 50C may also have surfaces raised from respective surfaces of the fins 58 and may have facets.

The epitaxial source/drain regions 100 are in situ doped during growth to form source/drain regions. The epitaxial source/drain regions 100 have the same doping type as the respective LDD regions 92, and may be doped with the same dopants or different dopants. The epitaxial source/drain regions 100 may have an impurity concentration of between about $10^{19}$ cm$^{-3}$ and about $10^{21}$ cm$^{-3}$. The n-type and/or p-type impurities for source/drain regions may be any of the impurities previously discussed. Because the epitaxial source/drain regions 100 are in situ doped during growth, they are not doped by implantation. However, the doping profile and concentration of the LDD regions 92 produced according to some embodiments may be similar to that which would be produced if the epitaxial source/drain regions 100 were doped by implantation. Improving the doping profile and concentration of the LDD regions 92 may improve the performance and reliability of the resulting semiconductor devices.

Figure 16B:
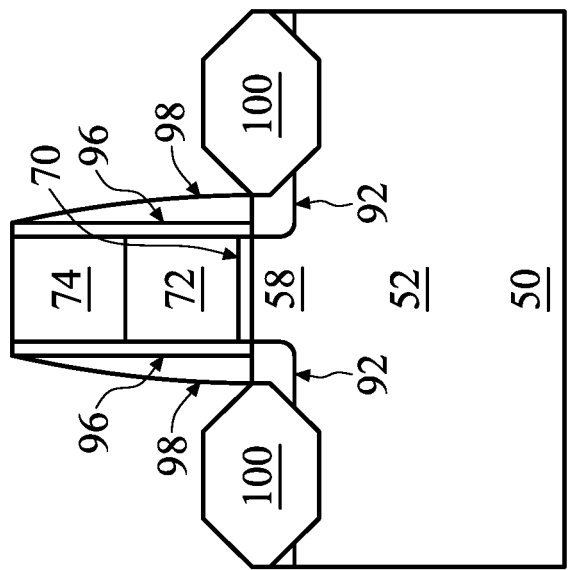
Figure 16A:
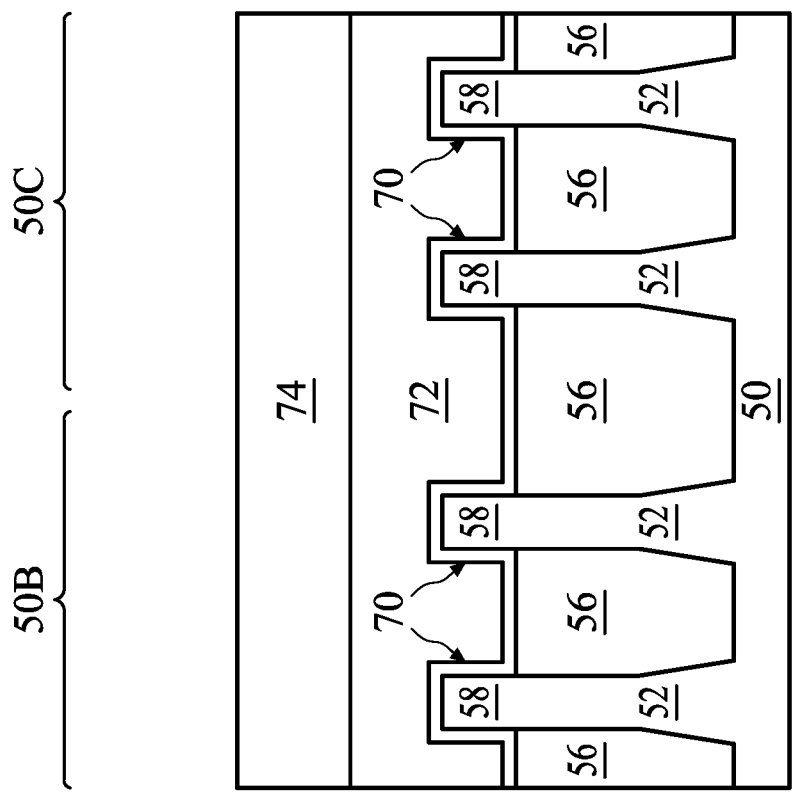
Figure 16C:
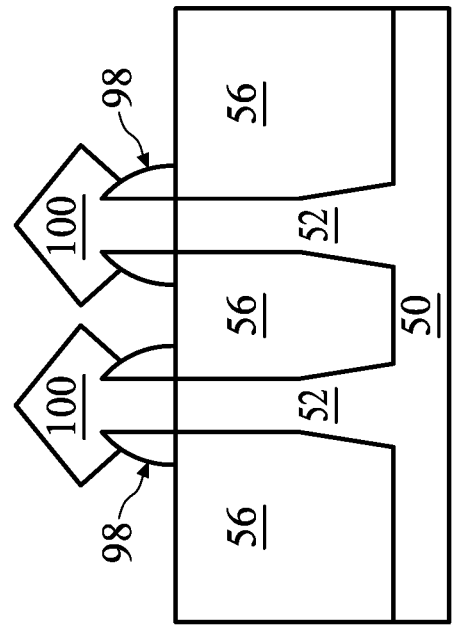
Figure 16D:
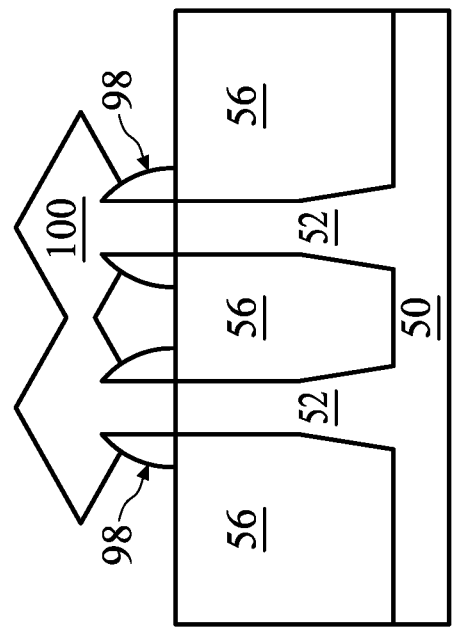

As a result of the epitaxy processes used to form the epitaxial source/drain regions 100 in the region 50B and the region 50C, upper surfaces of the epitaxial source/drain regions have facets which expand laterally outward beyond a sidewalls of the fins 58. In some embodiments, these facets cause adjacent epitaxial source/drain regions 100 of a same finFET to merge as illustrated by FIG. 16C. In other embodiments, adjacent epitaxial source/drain regions 100 remain separated after the epitaxy process is completed as illustrated by FIG. 16D.

Figure 17B:
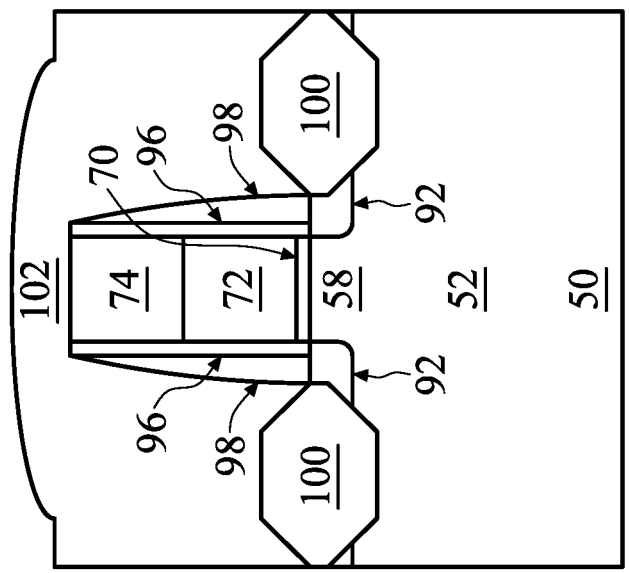
Figure 17A:
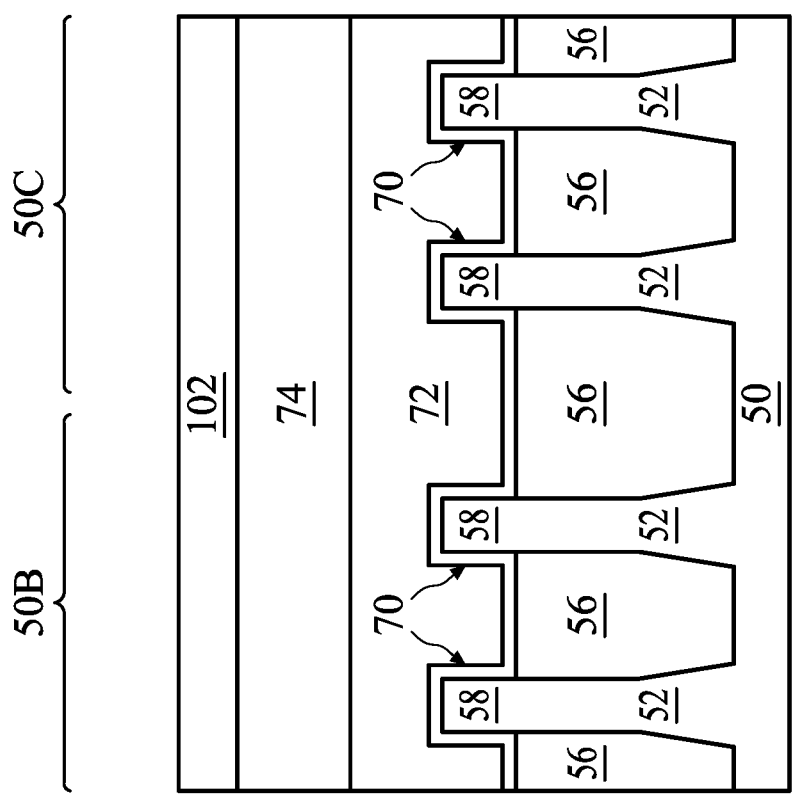

In FIGS. 17A and 17B, an interlayer dielectric (ILD) 102 is deposited over the substrate 50. The ILD 102 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 102 and the epitaxial source/drain regions 100, the gate spacers 98, the gate seal spacers 96, and the masks 74.

Figure 18B:
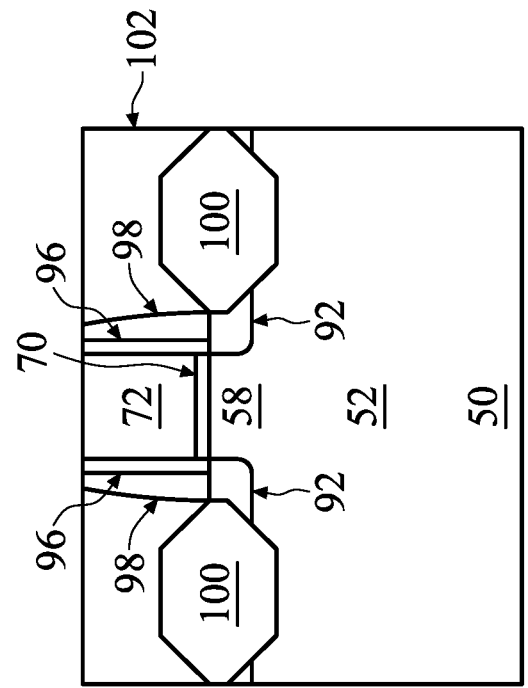
Figure 18A:
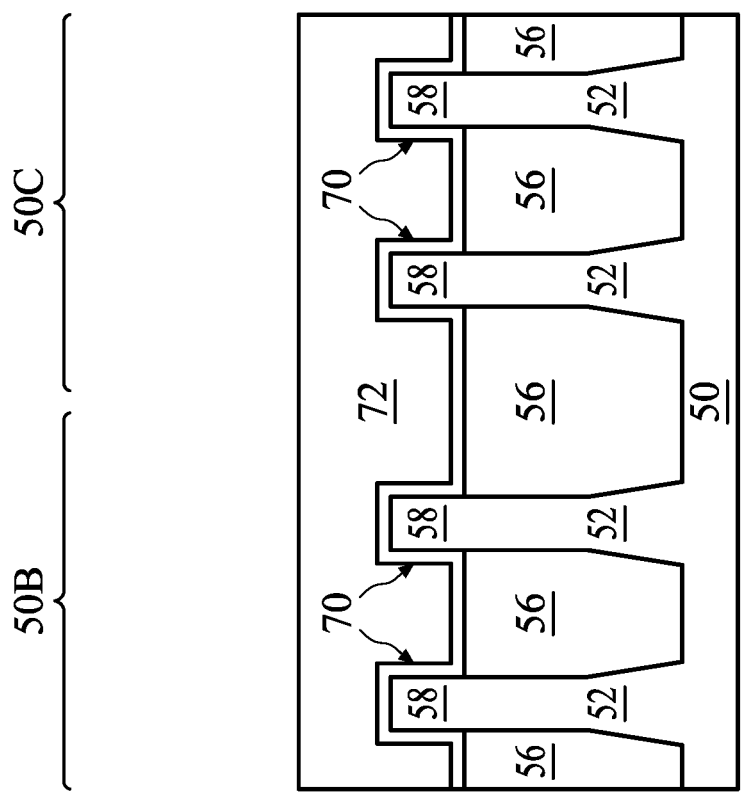

In FIGS. 18A and 18B, a planarization process, such as a CMP, may be performed to level the top surface of the ILD 102 with the top surfaces of the dummy gates 72. The planarization process may also remove the masks 74 on the dummy gates 72, and portions of the gate seal spacers 96 and the gate spacers 98 along sidewalls of the masks 74. After the planarization process, top surfaces of the dummy gates 72, the gate seal spacers 96, the gate spacers 98, and the ILD 102 are level. Accordingly, the top surfaces of the dummy gates 72 are exposed through the ILD 102.

Figure 19B:
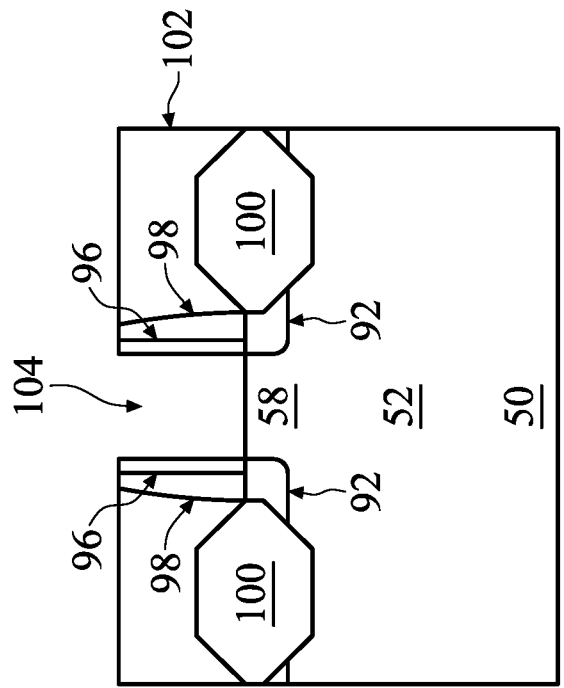
Figure 19A:
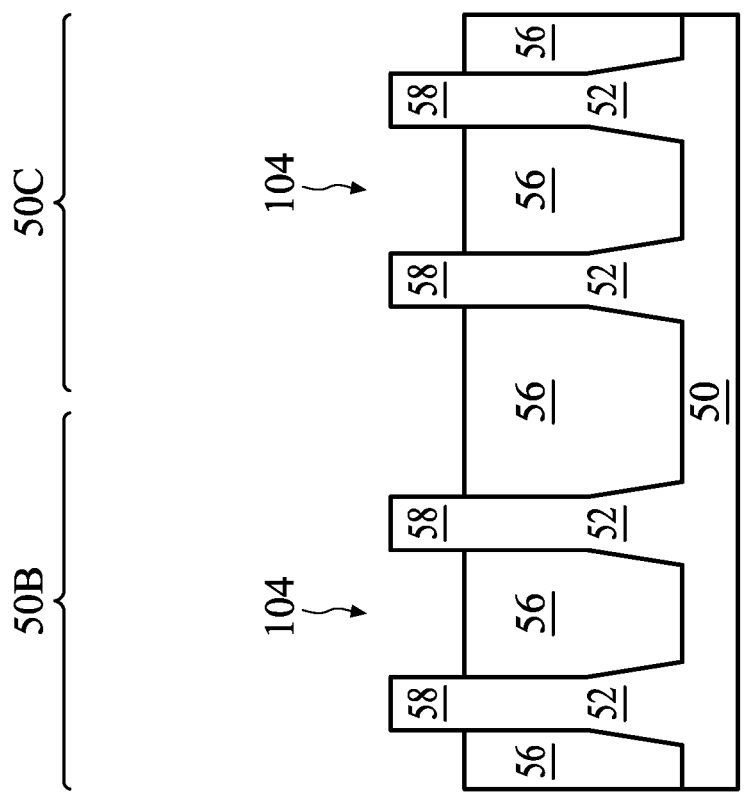

In FIGS. 19A and 19B, the dummy gates 72 and portions of the dummy dielectric layer 70 directly underlying the exposed dummy gates 72 are removed in an etching step(s), so that recesses 104 are formed. In some embodiments, the dummy gates 72 are removed by an anisotropic dry etch process. For example, the etching process may include a dry etch process using reaction gas(es) that selectively etch the dummy gates 72 without etching the ILD 102 or the gate spacers 98. Each recess 104 exposes a channel region of a respective fin 58. Each channel region is disposed between neighboring pairs of the epitaxial source/drain regions 100. During the removal, the dummy dielectric layer 70 may be used as an etch stop layer when the dummy gates 72 are etched. The dummy dielectric layer 70 may then be removed after the removal of the dummy gates 72.

Figure 20B:
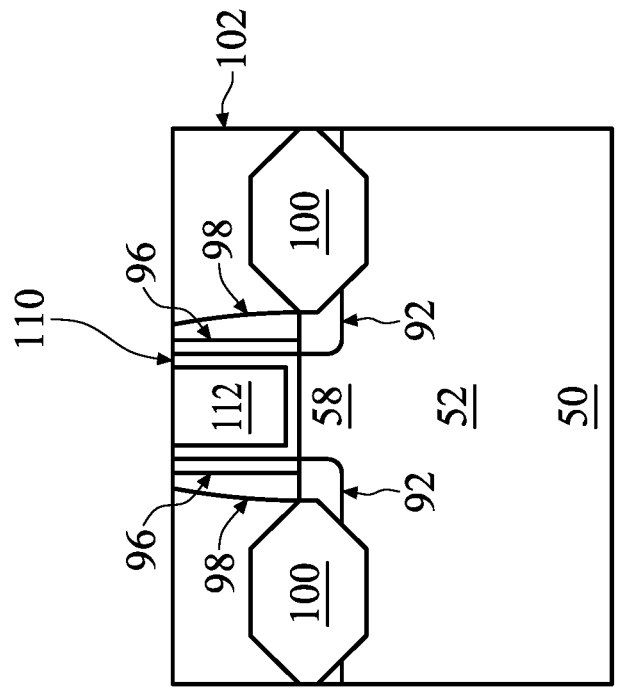
Figure 20A:
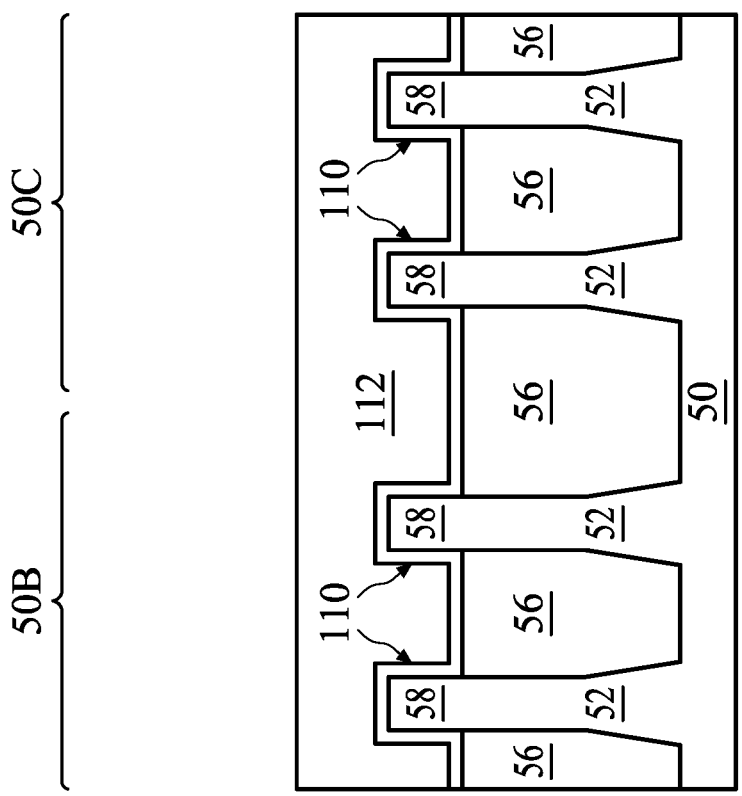

In FIGS. 20A and 20B, gate dielectric layers 110 and gate electrodes 112 are formed for replacement gates. Gate dielectric layers 110 are deposited conformally in the recesses 104, such as on the top surfaces and the sidewalls of the fins 58 and on sidewalls of the gate seal spacers 96/gate spacers 98. The gate dielectric layers 110 may also be formed on top surface of the ILD 102. In accordance with some embodiments, the gate dielectric layers 110 comprise silicon oxide, silicon nitride, or multilayers thereof. In some embodiments, the gate dielectric layers 110 are a high-k dielectric material, and in these embodiments, the gate dielectric layers 110 may have a k value greater than about 7.0, and may include a metal oxide or a silicate of Hf, Al, Zr, La, Mg, Ba, Ti, Pb, and combinations thereof. In embodiments where the gate dielectric layers 110 are a high-k dielectric material, interfacial layers (not shown) may be formed on the fins 58, and the gate dielectric layers 110 may be formed on the interfacial layers. The interfacial layers may be formed of, e.g., silicon oxide, and may be formed by, e.g., oxidizing the fins 58 in the recesses 104. The formation methods of the gate dielectric layers 110 may include Molecular-Beam Deposition (MBD), ALD, PECVD, and the like.

The gate electrodes 112 are deposited over the gate dielectric layers 110, respectively, and fill the remaining portions of the recesses 104. The gate electrodes 112 may be a metal-containing material such as TiN, TaN, TaC, Co, Ru, Al, combinations thereof, or multi-layers thereof. For example, although a single gate electrode 112 is illustrated, any number of work function tuning layers may be deposited in the recesses 104. After the filling of the gate electrodes 112, a planarization process, such as a CMP, may be performed to remove the excess portions of the gate dielectric layers 110 and the material of the gate electrodes 112, which excess portions are over the top surface of the ILD 102. The remaining portions of material of the gate electrodes 112 and the gate dielectric layers 110 thus form replacement gates of the resulting FinFETs. The gate electrodes 112 and the gate dielectric layers 110 may be collectively referred to herein as the "gate" or "gate stack." The gate and the gate stacks may extend along sidewalls of a channel region of the fins 58.

The formation of the gate dielectric layers 110 in the region 50B and the region 50C may occur simultaneously such that the gate dielectric layers 110 in each region are formed from the same materials, and the formation of the gate electrodes 112 may occur simultaneously such that the gate electrodes 112 in each region are formed from the same materials. In some embodiments, the gate dielectric layers 110 in each region may be formed by distinct processes, such that the gate dielectric layers 110 may be different materials, and the gate electrodes 112 in each region may be formed by distinct processes, such that the gate electrodes 112 may be different materials. Various masking steps may be used to mask and expose appropriate regions when using distinct processes.

Figure 21A:
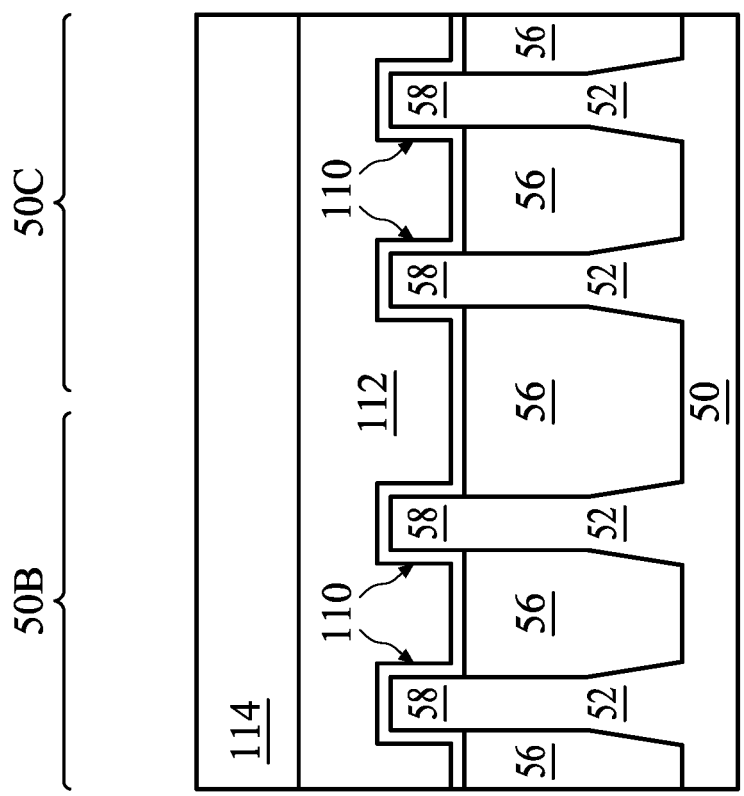
Figure 21B:
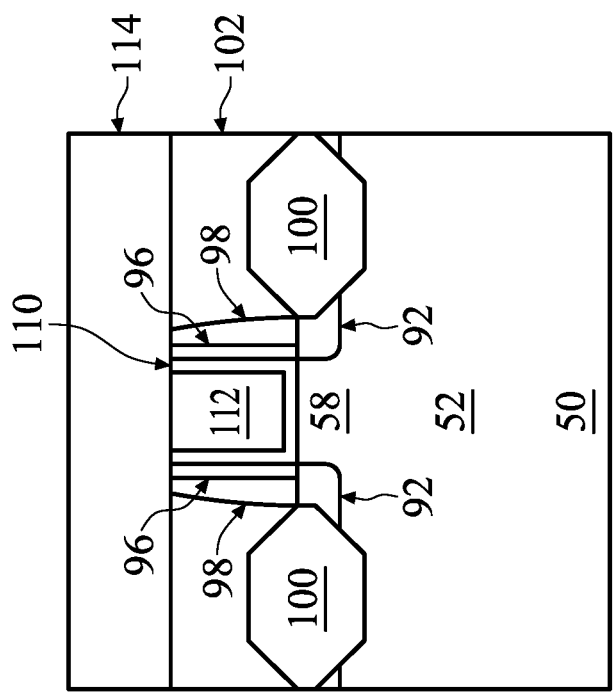

In FIGS. 21A and 21B, an ILD 114 is formed over the gate dielectric layers 110, gate electrodes 112, gate spacers 98, gate seal spacers 96, and ILD 102. In an embodiment, the ILD 114 is a flowable film formed by a flowable CVD method. In some embodiments, the ILD 114 is formed of a dielectric material such as PSG, BSG, BPSG, USG, or the like, and may be deposited by any suitable method, such as CVD and PECVD.

In FIGS. 22A and 22B, contacts 116 and 118 are formed through the ILD 114 and 102. Openings for the contacts 116 are formed through the ILD 114 and 102, and openings for the contacts 118 are formed through the ILD 114. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 114. The remaining liner and conductive material form the contacts 116 and 118 in the openings. An anneal process may be performed to form a silicide at the interface between the epitaxial source/drain regions 100 and the contacts 116. The contacts 116 are physically and electrically coupled to the epitaxial source/drain regions 100, and the contacts 118 are physically and electrically coupled to the gate electrodes 112. The contacts 116 and 118 may be formed in different processes, or may be formed in the same process. Although shown as being formed in the same cross-sections, it should be appreciated that each of the contacts 116 and 118 may be formed in different cross-sections, which may avoid shorting of the contacts 116 and 118.

Embodiments may achieve advantages. By doping the spacer layer with boron using a plasma doping process and annealing the dopant using a high temperature anneal process, the LDD regions 92 in the region 50B have a graded dopant concentration from the top of the fin to the bottom of the fin, and the channel region may be substantially free of boron. This may reduce the resistance (e.g., contact resistance) of the FinFET device formed. According to some embodiments, the dopant concentration at the bottom of the fins may be 8 times to 15 times larger than dopant concentrations obtained by ion implantations methods. In addition, the high temperature mask removal process using SPM may reduce fin height loss, thereby avoiding degradation of the on-current of the FinFET device. Further, introducing $O_2$ in the ambient gas of the anneal process reduces the outgassing of the dopants (e.g., boron), thereby improving the dopant concentration in the LDD regions 92 and avoiding tool safety issues associated with outgassing.

In an embodiment, a method includes: forming a first fin on a first region of a substrate and a second fin on a second region of the substrate; forming a first gate stack on the first fin and a second gate stack on the second fin; forming a spacer layer over the first fin, the second fin, the first gate stack, and the second gate stack; forming a first mask over the spacer layer in the second region, the first mask covering the second fin; after the forming the first mask, implanting a first dopant having a first doping type in the spacer layer over the first fin; removing the first mask; performing a first anneal process to drive the first dopant into the first fin; and epitaxially growing a first source/drain region in the first fin.

In some embodiments, the implanting the first dopant having the first doping type in the spacer layer includes: forming a first dopant layer on the spacer layer and the first mask during a first pulse of a plasma doping process; and implanting the first dopant in the spacer layer during a second pulse of the plasma doping process. In some embodiments, the removing the first mask includes: after the plasma doping process, removing the first dopant layer and the first mask in a wet etch process. In some embodiments, the performing the first anneal process drives the first dopant into the first fin and the first gate stack. In some embodiments, the wet etch process is performed using a Sulfuric Peroxide Mixture (SPM) solution. In some embodiments, the wet etch process is performed for a time interval of from about 30 seconds to about 120 seconds at a temperature of from about 150° C. to about 180° C. In some embodiments, the implanting the first dopant having the first doping type in the spacer layer further includes: implanting the first dopant in the first mask during the second pulse of the plasma doping process. In some embodiments, the performing the first anneal process drives the first dopant under the first gate stack in the first fin. In some embodiments, the method further includes: forming isolation regions adjacent the first fin, where the performing the first anneal process drives the first dopant into the isolation regions. In some embodiments, the method further includes, after the performing the first anneal process: forming a second mask over the spacer layer in the first region, the second mask covering the first fin; after the forming the second mask, implanting a second dopant having a second doping type different from the first doping type in the spacer layer over the second fin; after the implanting the second dopant, removing the second mask; performing a second anneal process to drive the second dopant into the second fin; and epitaxially growing a second source/drain region in the second fin.

In an embodiment, a method includes: forming a semiconductor fin protruding from a substrate; depositing a spacer layer over the semiconductor fin; after the depositing the spacer layer over the semiconductor fin, implanting a first dopant in the spacer layer and depositing a dopant layer of the first dopant on the spacer layer in alternating repeating steps; removing the dopant layer; and performing a thermal anneal process to drive the first dopant into the semiconductor fin from the spacer layer.

In some embodiments, the implanting the first dopant in the spacer layer and the depositing the dopant layer of the first dopant on the spacer layer includes doping the spacer layer using a plasma doping process. In some embodiments, the plasma doping process is performed using a gas source including first precursor gas, a second precursor gas, and an inert gas, the first precursor gas including the first dopant. In some embodiments, the first precursor gas includes B, the second precursor gas includes $H_2$, and the inert gas includes Ar. In some embodiments, the gas source includes from about 5% to about 15% of the first precursor gas, from about 30% to about 85% of the second precursor gas, and from about 33% to about 66% of the inert gas. In some embodiments, the plasma doping process is performed with an implantation energy of from about 0.5 KV to about 3 KV.

In an embodiment, a device includes: a fin extending from a substrate; an isolation region surrounding the fin, the isolation region doped with a first dopant having a first doping type; a gate stack on the fin; a gate spacer on the fin adjacent the gate stack, the gate spacer doped with the first dopant; a lightly doped region in the fin under the gate spacer, the lightly doped region doped with the first dopant; and an epitaxial source/drain region in the fin, the epitaxial source/drain region extending through the lightly doped region, the epitaxial source/drain region having the first doping type.

In some embodiments, a concentration of the first dopant in the lightly doped region decreases in a direction extending from a top of the lightly doped region to a bottom of the lightly doped region, and a concentration of the first dopant in the isolation region decreases in a direction extending from a top of the isolation region to a bottom of the isolation region. In some embodiments, the gate stack is doped with the first dopant. In some embodiments, the gate stack is free of the first dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first gate stack on a first semiconductor fin and a second gate stack on a second semiconductor fin, the first semiconductor fin and the second semiconductor fin protruding above an isolation region;
    depositing a spacer layer on the first gate stack, the second gate stack, the first semiconductor fin, the second semiconductor fin, and the isolation region;
    forming a mask on the spacer layer, the mask covering the second semiconductor fin, the first semiconductor fin uncovered by the mask;
    implanting a first dopant having a first doping type in the spacer layer over the first semiconductor fin while the mask shields the spacer layer over the second semiconductor fin;
    performing an anneal process to drive the first dopant from the spacer layer into the first semiconductor fin and the isolation region, wherein the spacer layer covers the first semiconductor fin and the isolation region during the anneal process; and
    after performing the anneal process, patterning the spacer layer to form a first gate spacer and a second gate spacer, the first gate spacer extending along a sidewall of the first gate stack, the second gate spacer extending along a sidewall of the second gate stack.

2. The method of claim 1 further comprising:
    after patterning the spacer layer, forming a third gate spacer and a fourth gate spacer, the third gate spacer extending along a sidewall of the first gate spacer, the fourth gate spacer extending along a sidewall of the second gate spacer.

3. The method of claim 1 further comprising:
    forming a source/drain region in the first semiconductor fin, the source/drain region having the first doping type.

4. The method of claim 1, wherein the first gate stack is formed on a channel region of the first semiconductor fin, the channel region being free of the first dopant after performing the anneal process.

5. The method of claim 4, wherein driving the first dopant into the first semiconductor fin forms a lightly doped drain/source region in the first semiconductor fin, the lightly doped drain/source region partially disposed under the channel region.

6. The method of claim 1, wherein after performing the anneal process, a concentration of the first dopant in the isolation region decreases in a direction extending from a top of the isolation region to a bottom of the isolation region.

7. The method of claim 1, wherein implanting the first dopant in the spacer layer comprises:
    depositing a layer of the first dopant on the spacer layer during a discharge pulse of a plasma doping process; and
    driving the first dopant into the spacer layer during an implant pulse of the plasma doping process.

8. The method of claim 7 further comprising:
    removing the mask and the layer of the first dopant with a wet etch process, wherein the wet etch process does not remove the first dopant from the spacer layer.

9. A method comprising:
    depositing a dielectric layer on a semiconductor fin and an isolation region, the semiconductor fin protruding above the isolation region;
    performing a plasma doping process comprising:
        depositing a layer of a first dopant on the dielectric layer during a discharge pulse of the plasma doping process; and
        implanting particles of the first dopant into the dielectric layer during an implant pulse of the plasma doping process;
    removing the layer of the first dopant with an etch process, wherein the etch process does not remove the particles of the first dopant implanted into the dielectric layer; and
    performing a thermal anneal process to drive the particles of the first dopant from the dielectric layer into the semiconductor fin and the isolation region, wherein the dielectric layer covers the semiconductor fin and the isolation region during the thermal anneal process.

10. The method of claim 9, wherein the discharge pulse comprises generating a plasma from a precursor for the first dopant, and the implant pulse comprises accelerating the particles of the first dopant across the plasma.

11. The method of claim 10, wherein the precursor for the first dopant is $B_2H_6$.

12. The method of claim 9, wherein the particles of the first dopant are implanted with an implantation energy in a range of 0.1 KV to 3 KV.

13. The method of claim 9, wherein a dosage of the first dopant during the implant pulse is in a range of 1E15 atoms/cm$^3$ to 5E16 atoms/cm$^3$.

14. The method of claim 9, wherein the etch process comprises a wet etch performed using an acid comprising $H_2SO_4$ and $H_2O_2$.

15. The method of claim 9, wherein the thermal anneal process is performed in an environment comprising oxygen and nitrogen.

16. The method of claim 9, wherein after performing the thermal anneal process, a concentration of the first dopant in the isolation region decreases in a direction extending from a top of the isolation region to a bottom of the isolation region.

17. The method of claim 9 further comprising:
    patterning the dielectric layer to form a spacer on the semiconductor fin.

18. A method comprising:
    forming a gate stack on a semiconductor fin, the semiconductor fin protruding above an isolation region;
    depositing an insulating layer on the gate stack, the semiconductor fin, and the isolation region;
    implanting a dopant having a first doping type in the insulating layer;
    forming a lightly doped drain/source region in the semiconductor fin by driving the dopant from the insulating layer into the semiconductor fin and the isolation region while the insulating layer covers the semiconductor fin and the isolation region;

after forming the lightly doped drain/source region, patterning the insulating layer to form a gate spacer on a sidewall of the gate stack; and forming a source/drain region in the lightly doped drain/source region, the source/drain region having the first doping type.

19. The method of claim 18, wherein the gate stack is formed above a channel region of the semiconductor fin, and the lightly doped drain/source region is formed beneath the channel region of the semiconductor fin.

20. The method of claim 18, wherein implanting the dopant in the insulating layer comprises:

depositing a layer of the dopant on the insulating layer during a discharge pulse of a plasma doping process; and driving the dopant into the insulating layer during an implant pulse of the plasma doping process.

* * * * *